(12) United States Patent
Dutta

(10) Patent No.: US 8,357,960 B1
(45) Date of Patent: Jan. 22, 2013

(54) MULTISPECTRAL IMAGING DEVICE AND MANUFACTURING THEREOF

(75) Inventor: Achyut Kumar Dutta, Sunnyvale, CA (US)

(73) Assignee: Banpil Photonics, Inc., Santa Clara, CA (US)

( * ) Notice: Subject to any disclaimer, the term of this patent is extended or adjusted under 35 U.S.C. 154(b) by 495 days.

(21) Appl. No.: 12/562,127

(22) Filed: Sep. 17, 2009

Related U.S. Application Data

(60) Provisional application No. 61/098,237, filed on Sep. 18, 2008.

(51) Int. Cl.
*H01L 33/00* (2010.01)
(52) U.S. Cl. ........ 257/292; 257/186; 257/293; 257/233; 257/E33.076
(58) Field of Classification Search .................. 257/186, 257/293, 233, 292, E33.076
See application file for complete search history.

(56) References Cited

U.S. PATENT DOCUMENTS

| | | | | |
|---|---|---|---|---|
| 4,814,847 A * | 3/1989 | Tabatabaie | ..................... | 257/186 |
| 5,266,814 A * | 11/1993 | Inata et al. | ...................... | 257/25 |
| 6,667,528 B2 * | 12/2003 | Cohen et al. | ................... | 257/469 |
| 7,015,139 B2 * | 3/2006 | Yamashita | ..................... | 438/674 |
| 7,132,677 B2 * | 11/2006 | Kim et al. | ......................... | 257/14 |
| 7,183,127 B2 * | 2/2007 | Kuriyama et al. | ............... | 438/34 |
| 2005/0255581 A1 * | 11/2005 | Kim et al. | ................... | 435/287.2 |
| 2007/0158661 A1 * | 7/2007 | Lu et al. | ........................... | 257/79 |
| 2007/0210349 A1 * | 9/2007 | Lu et al. | ........................ | 257/252 |
| 2008/0105296 A1 * | 5/2008 | Samuelson et al. | ............ | 136/255 |

* cited by examiner

*Primary Examiner* — Eugene Lee

(57) ABSTRACT

This invention relates to photodetector and its array in the form of a image sensor having multispectral detection capability covering the wavelengths from ultra-violet (UV) or near UV to shortwave infrared (over 1700 nm), ultra-violet (UV) or near UV to mid infrared (3500 nm), or ultra-violet (UV) or near UV to 5500 nm. More particularly, this invention is related to the multicolor detector, which can detect the light wavelengths ranges from as low as UV to the wavelengths over 1700 nm covering the most of the communication wavelength, and also from UV to as high as 5500 nm using of the single monolithic detector fabricated on the single wafer. This invention is also related to the multispectral photodetector arrays for multicolor imaging, sensing, and advanced communication. Our innovative approach utilizes surface incident type (either top- or bottom-illuminated type) photodiode structure having single absorption layer and consisting of more than micro-nano-scaled 3-dimensional (3-D) blocks which can provide broader spectral response than that of the absorption layer made from the same type of material having macro-scaled structure.

21 Claims, 21 Drawing Sheets

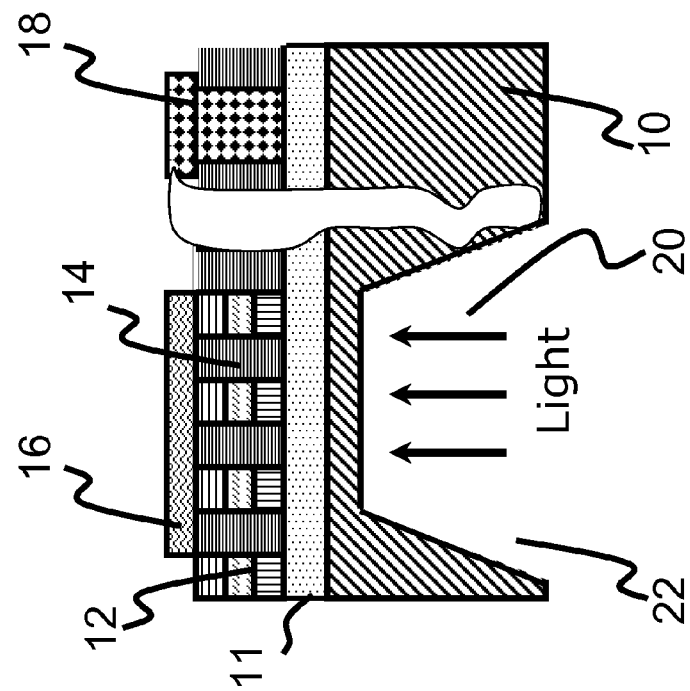
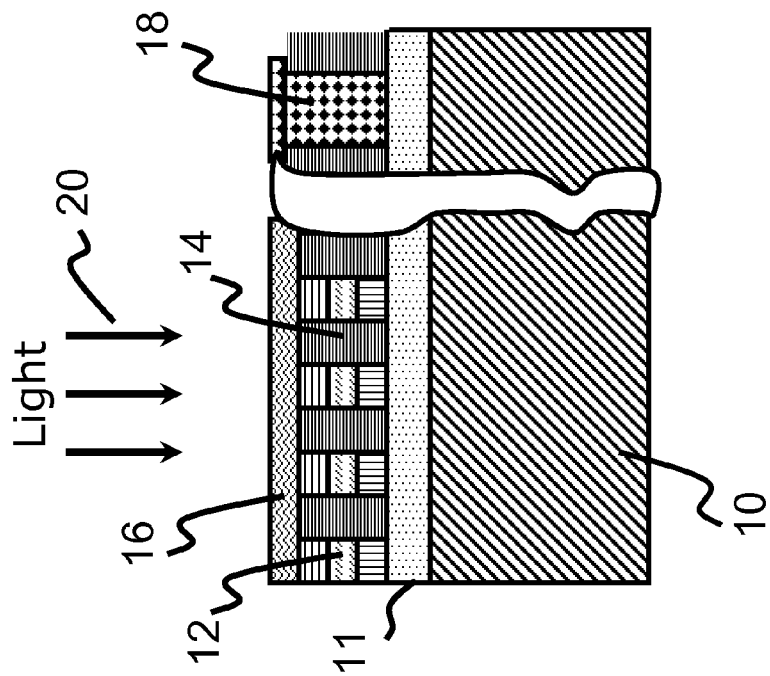
FIG. 6C
FIG. 6D

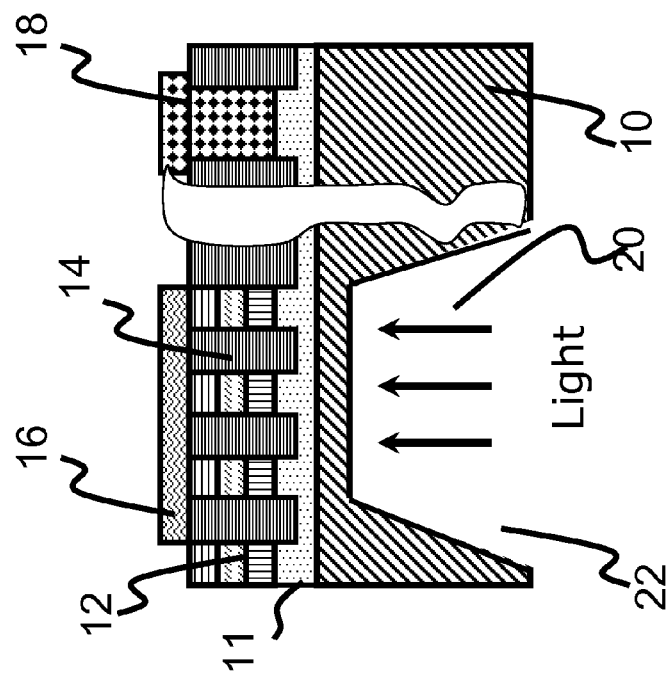
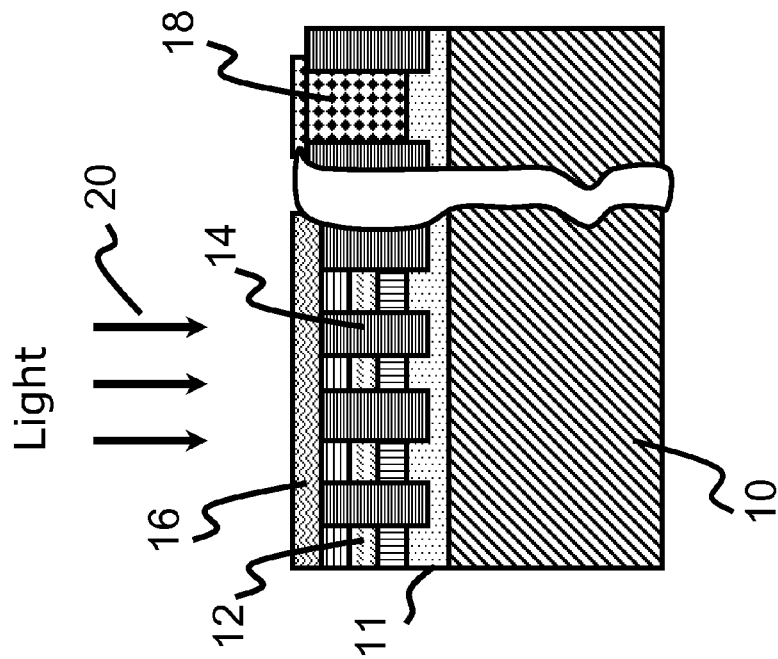
FIG. 6H
FIG. 6G

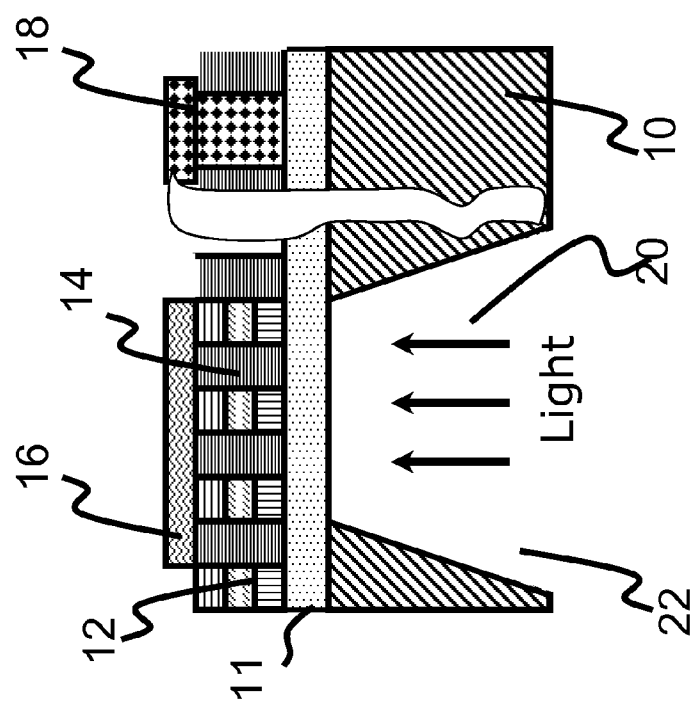

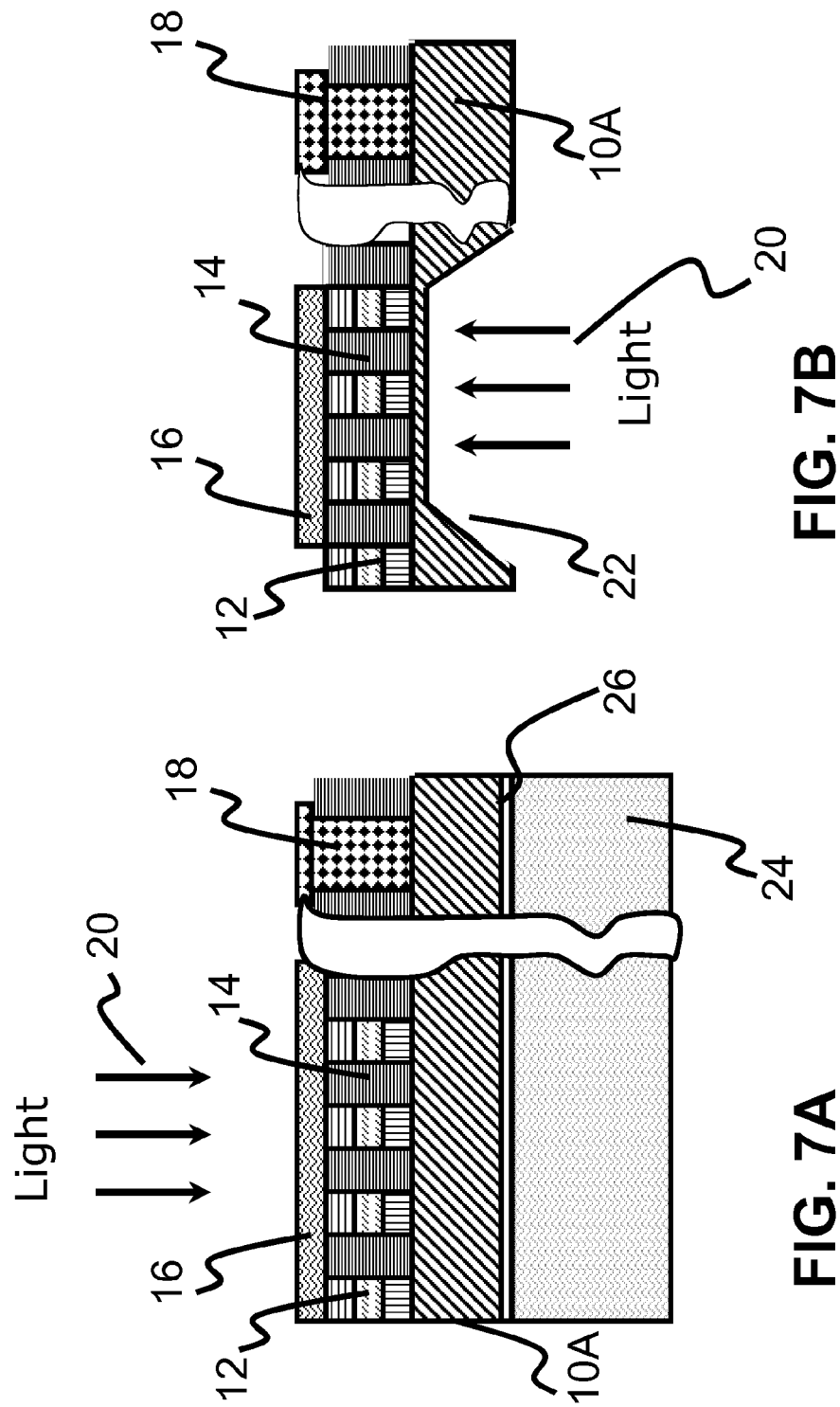

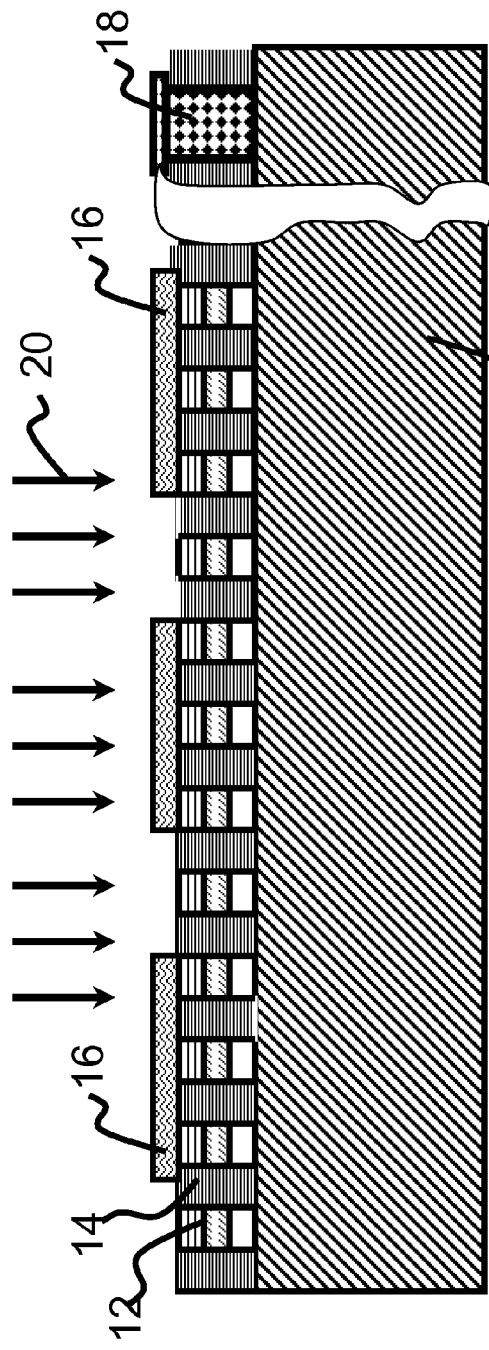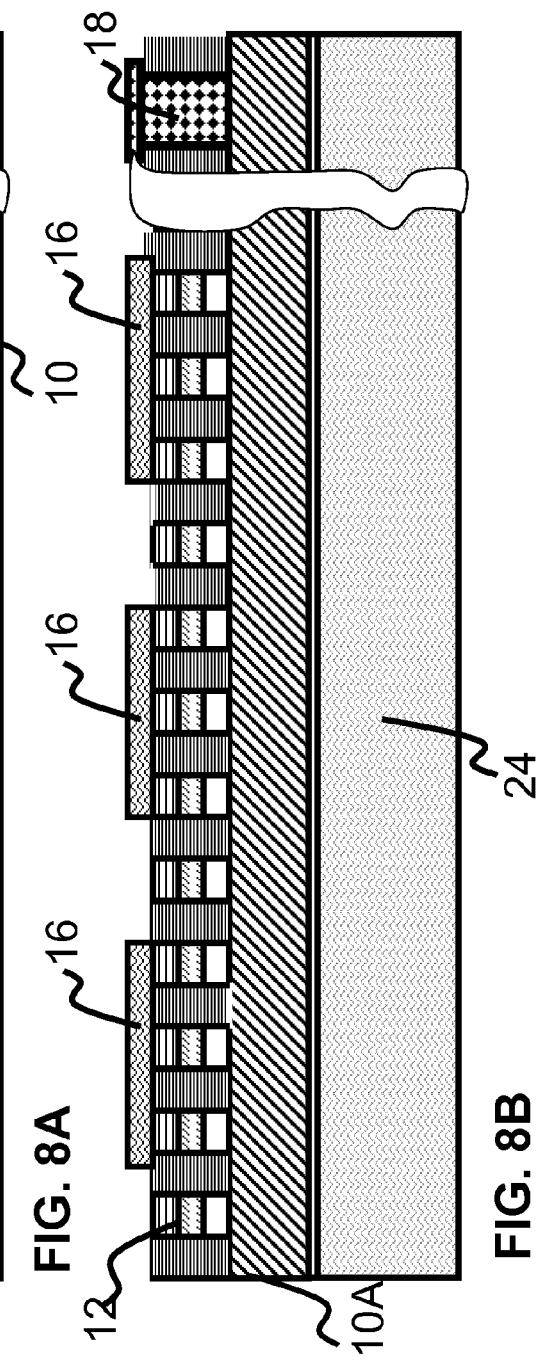

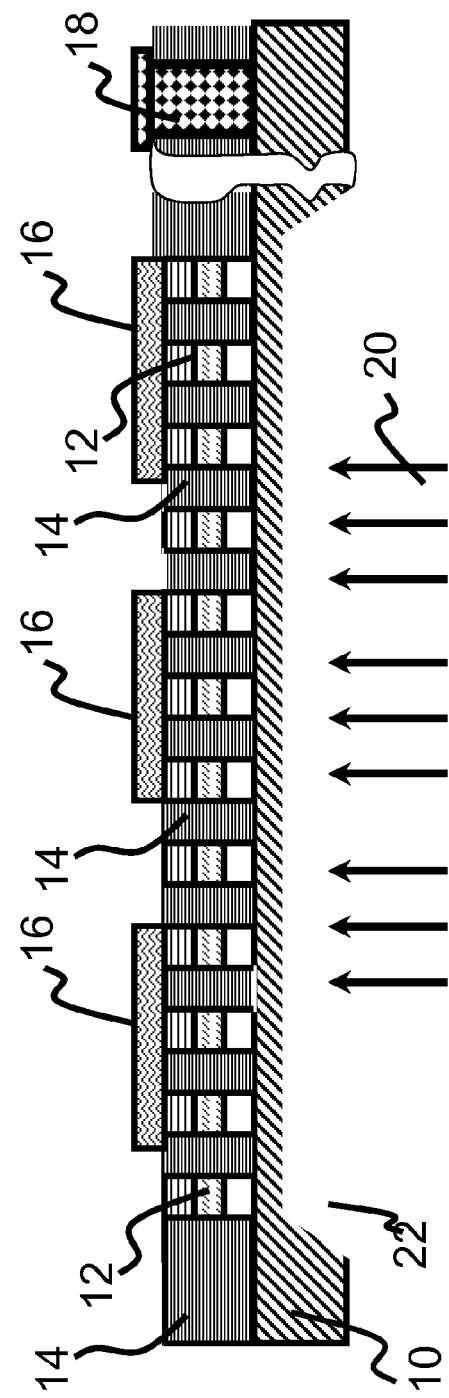

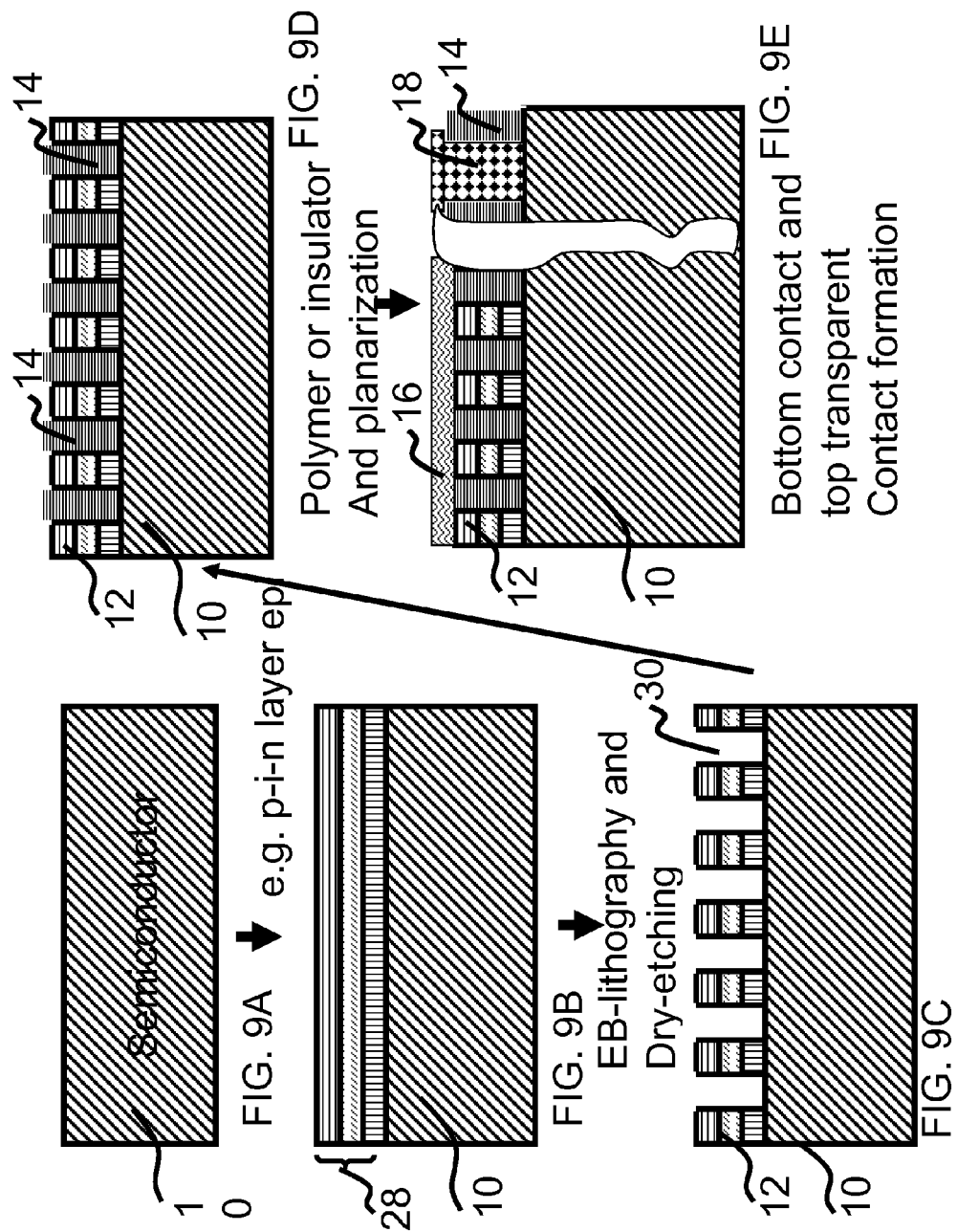

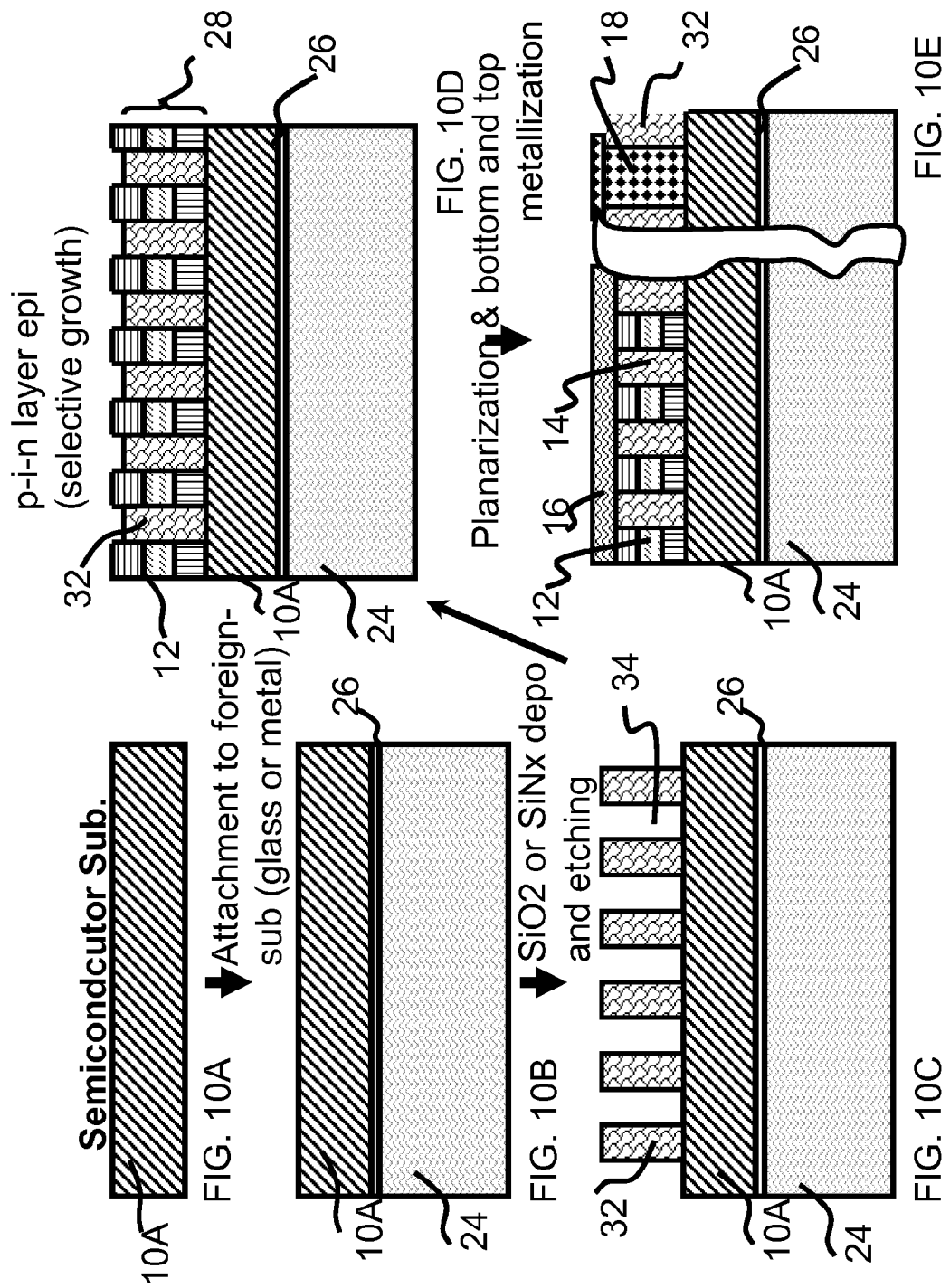

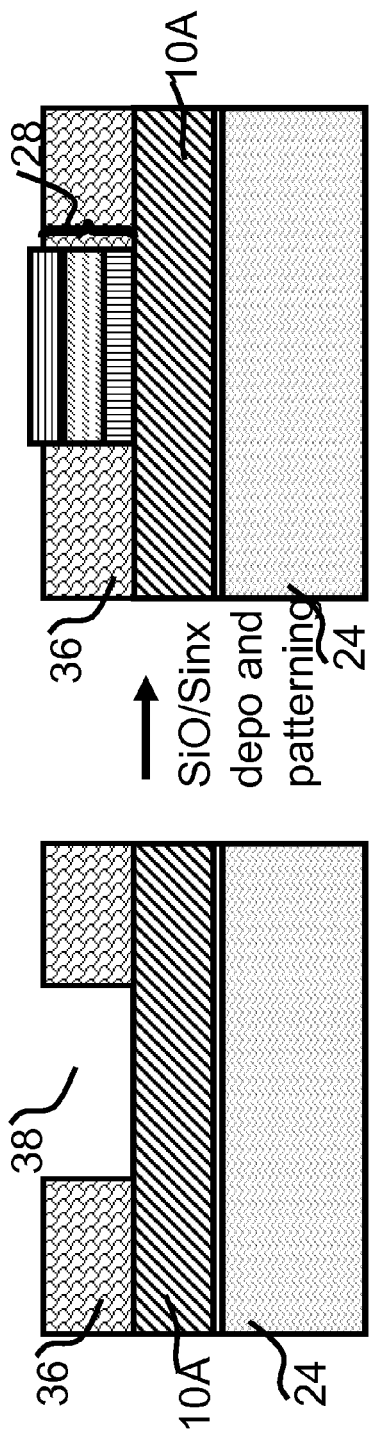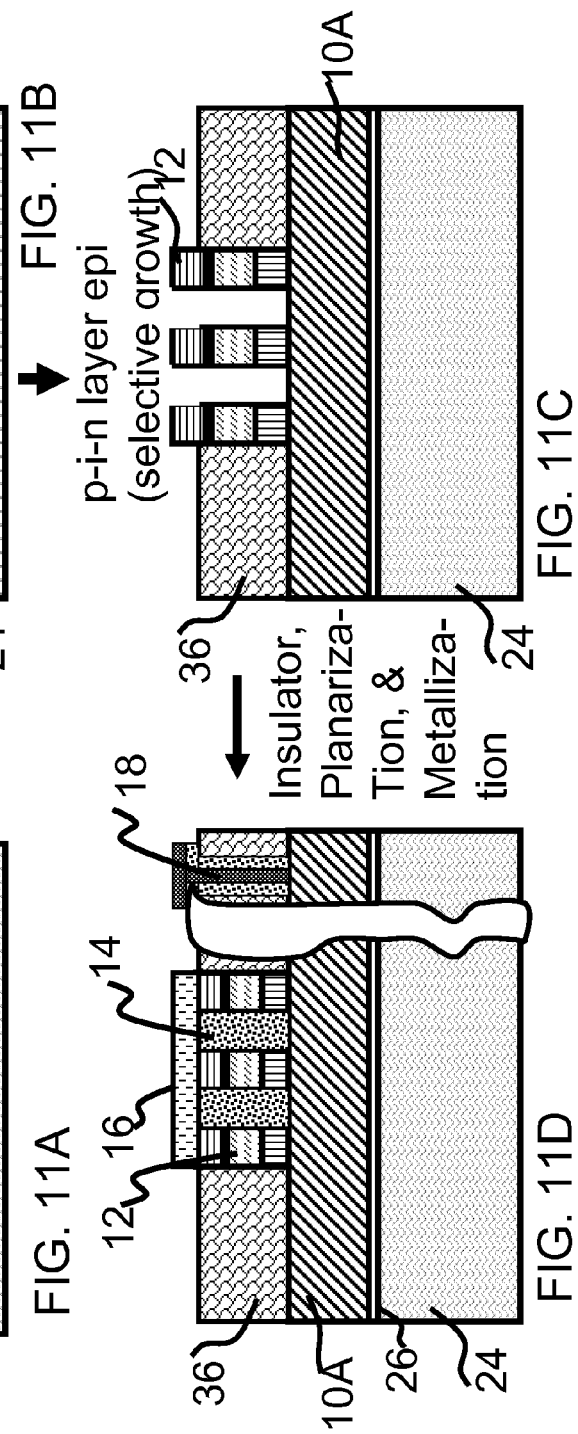

MULTISPECTRAL IMAGING DEVICE AND MANUFACTURING THEREOF

CROSS REFERENCE TO RELATED APPLICATIONS

This application claims the benefit of U.S. Provisional Application No. 61/098,237 filed on Sep. 18, 2008.

FIELD OF THE INVENTION

This invention relates to photodetector and image sensor having multispectral detection capability covering the wavelengths from ultra-violet (UV) or near UV to mid infrared (3500 nm and also up to 5500 nm). More particularly, this invention is related to the multicolor detector, which can detect the light wavelengths ranges from as low as UV to the wavelengths as high as 3500 nm covering the most of the communication wavelength, and also from UV to as high as 5500 nm using of the single monolithic detector fabricated on the single wafer. This invention is also related to the multispectral photodetector arrays for multicolor imaging, sensing, and advanced communication.

BACKGROUND OF THE INVENTION

Solid-state imaging devices with higher resolution are used in many commercial applications especially camera and also for other light imaging uses. Such imaging devices typically comprise of CCD (charge coupled device) photo detector arrays with associated switching elements, and address (scan) and read out (data) lines. This CCD technology is matured so much that now days a million of pixels and surrounding circuitry can be fabricated using the CMOS (complimentary metal oxide semiconductor) technology. As today's CCD technology is based on silicon (Si)-technology, the detectable spectral ranges of CCD are limited to the wavelengths below 1 μm where Si exhibits absorption. Besides, CCD based imaging technique has also other shortcomings such as high efficiency response combined with high quantum efficiency over broad spectral ranges. This broad spectral detection is required in many applications. One of them is the free space laser communication where shorter (in visible ranges) and near infrared wavelengths is expected to be used. Photodiode array having broad spectral detection capability, disclosed in this invention, is expected to provide those features not available in today's CCD technology. With well designed of the array, appreciable resolution can also be achieved in photodiode array technology.

Photodetectors (a.k.a. photodiode) especially of p-i-n type have been studied extensively over the last decade for its application in optical communication. These photodiodes are for near infrared detection, especially the wavelength vicinity to 1310 and 1550 nm, where today's optical communication is dealt with. Now a day, the photodetector speed as high as 40 Gb/s, as described in the publication by Dutta et. al. in IEEE Journal of Lightwave Technology, vol. 20, pp. 2229-2238 (2002) is achieved. Photodetector having a quantum efficiency as close to 1, as described in the publication by Emsley et. al., in the IEEE J. Selective Topics in Quantum Electronics, vol. 8(4), pp. 948-955 (2002), is also available for optical communication. These photodiode uses InGaAs material as absorption material, and the diode is fabricated on the InP wafer. On the other hand, Si substrate is used for the photodiode for detection of visible radiation.

For covering multiple spectral ranges, two photodiodes fabricated from Si and InP technology and discretely integrated, can be used. Monolithically, wafer bonding technology to bond Si and InP can be used to fabricated the photodiode covering the wavelengths from visible to near infrared. However, the reliability of wafer bonding over wide range of temperature is still an unsolved issue and a high-speed operation is not feasible with a wafer bonding approach. It is highly desirable to have a monolithic photodetector array (forming image sensor), which could offer high bandwidth (GHz and above) combined with high quantum efficiency over a broad spectral ranges (<300 nm to 3500 nm and also to <300 nm to 5500 nm). For using especially in imaging purpose where CCD or Si based image sensor based device are used, the multicolor photodiode array with the possibility to rapidly and randomly address any pixel is also very much essential.

It is our objective to develop a monolithic photodiode array for broad spectral ranges covering from <300 nm to 3500 nm (and also from <300 to 5500 nm) wavelength detection with having frequency response as high as 10 GHz and above bandwidth, and high quantum efficiency over 90% over the entire wavelength region.

It is also our objective to develop a monolithic photodetector array (or single detector) for broad spectral ranges covering from <300 nm to 5500 nm with having the frequency response as high as 10 GHz and above bandwidth and high quantum efficiency over >90% over entire wavelength region.

Our innovative approach utilizes surface incident type (either top- or bottom-illuminated type) photodiode structure having single absorption layer and consisting of more than micro-nano-scaled 3-dimensional (3-D) blocks which can provide broad spectral response. Utilizing multiple micro-nano scaled blocks help to increase the absorption spectra more than the material using as the absorption layer. In addition, utilizing the multiple nano-scaled 3-D blocks help to increase the absorption over the wavelength due to the multiple reflections and diffractions inside the 3-D structures. The absorption layers will be designed to achieve the required quantum efficiency and also required speed. The photodiode can be used as the single element and also as the array form.

According to this invention, depending on the size and pitch of the 3-D blocks, percentage of light absorption over the wavelengths and also broadening the absorption spectra can also be the absorption spectra and absorption can be controlled.

According to the current invention, photodiodes having broad spectral ranges (<300 to 3500 nm and also <300 nm to 5500 nm), high quantum efficiency (>90%), and high frequency response, can be fabricated using the single wafer. According to this invention, in the case of photodiode array, each array can also be operated independently. The manufacturing thereof is also simpler as compared with the prior art. Some applications include multicolor imaging applications such as for astronomical observation, communication etc.

SUMMARY OF THE INVENTION

Accordingly, it is an object of the invention to provide the structures of single photodetector element (single pixel of image sensor), which could have the broad spectral detections, ranging from UV (or near UV) to shortwave infrared (2500 nm), UV (or near UV) to mid-infrared, UV (or near UV) to 3500 nm, or other from UV (or near UV) to 5500 nm.

It is also an object that the structure of each element photodiode could provide high quantum efficiency over 70% and beyond over broad spectral detection ranges, and also the high frequency response, 10 GHz and more (@ 3 dB bandwidth). The structure is easily to fabricate using the standard photodiode fabrication process.

Another object of this invention is to provide the photodiode array structure, which would have the broad spectral detection ranges, and each of its photodiode element (hereafter mentioned also as the pixel) could be operated independently. This photodiode array has the CCD or CMOS sensor like feature in addition to the broad spectral detection capabilities. This array of high counts can be used for multicolor imaging device purpose.

It is also an object of the invention to provide the top (also mentioned as the 'front')-illuminated type and bottom (also mentioned as the 'back')-type detector, which uses the structures having broad spectral detection capability as, mentioned previously.

Another object of the present invention is to provide the material types to be used for achieving broader spectral detection ranges for photodiode. These materials are easy to deposit/growth using the standard IC technology.

Another object of the invention is to use the InGaAs as the absorption layer (as the example) for the photodiode having broad spectral detection ranges, covering from <300 nm to 2500 nm or <300 nm to 3500 nm. This can be further be extending from near UV (or UV) to 5500 nm or more.

It is also an object of the invention to use the InGaAs as the absorption layer for the photodiode having broad spectral detection ranges, covering from <300 nm to 5500 nm.

It is also an object of the invention to use the InP wafer for fabricating the photodiode having broad spectral ranges.

Another object of the present invention is to provide the fabrication process to fabricate the single photodiode and its array using the standard IC fabrication process.

According to the invention, the single photodiode covering <300 nm (or UV) to 3500 nm or more, comprises, (i) an ohmic contact layer; (ii) a substrate; (iii) a first highly doped buffer layer, material-type same as the substrate; (iv) more than one micro-nano-scaled 3-D blocks, spaced with specific pitch or randomly arranged, each of block comprises with p-i-n structure or p-n structure, (a) doped layer either complete buffer layer and/or a portion of substrate layer (b) intrinsic (i-type) layer is formed using i-type InGaAs for absorption layer, grown on the top of the first doped layer; (c) a thin layer of second doped or lightly doped layer of InGaAs type on the top of absorption layer; (v) each 3-D block is separated by certain pitch or randomly arranged, (vi) the space between the 3-D blocks are filled or not filled by the insulator, (vii) a transparent layer of metal contact layer making the contact the top surface of the 3-D blocks, (viii) second metal contact, making ohmic contact on the bottom part of the 3-D blocks, top of the thick doped layer, or on the top of the substrate, wherein the light is illuminated surface (opening area) could be the circular, rectangular or square shaped, and they are designed in a way that light can be illuminated either from the top surface or from the bottom surface (substrate side).

To avoid large resistance due to the abrupt junction formation, the gradual doping can be used in between intrinsic absorption layer and the second highly doped layer. A thin layer of spacer layer of type second layer can be used in between the second highly doped layer and intrinsic layer.

According to the invention, the single photodiode covering <300 nm (or UV) to 5500 nm or more, comprises, (i) an ohmic contact layer; (ii) a substrate; (iii) a first highly doped buffer layer, material-type same as the substrate; (iv) more than one micro-nano-scaled 3-D blocks, spaced with specific pitch or randomly arranged, each of block comprises with p-i-n structure or p-n structure, (a) doped layer either complete buffer layer and/or a portion of substrate layer (b) single or plurality layers of $InAs_yP_{1-y}$ type material of different y, where y is <1 but >0; (c) intrinsic (i-type) or lightly doped layer of InGaAs for absorption layer, grown on the top on the top of the singular or plurality layers of $InAs_yP_{1-y}$ type material; (d) a thin layer of second highly doped and/or lightly doped layer of InGaAs type as recessed layer or a thin layer of the etch stopper layer on the top of absorption layer; (v) each 3-D block is separated by certain pitch or randomly arranged, (vi) the space between the 3-D blocks are filled or not filled by the insulator, (vii) a transparent layer of metal contact layer making the contact the top surface of the 3-D blocks, (viii) second metal contact, making ohmic contact on the bottom part of the 3-D blocks, top of the thick doped layer, or on the top of the substrate, wherein the light is illuminated surface (opening area) could be the circular, rectangular or square shaped, and they are designed in a way that light can be illuminated either from the top surface or from the bottom surface (substrate side).

To avoid large resistance due to the abrupt junction formation, the gradual doping can be used in between intrinsic absorption layer and the second highly doped layer. A thin spacer-layer of type second layer can be used in between the second highly doped layer and intrinsic layer.

Alternately, a graded layer can be incorporated in the structure to reduce the minority carrier trapping at the InAsP/InGaAs band edge discontinuity.

According to the invention, the photodiode array comprises: N.times.N array of photodiode elements, wherein each photodiode element (having broad spectral ranges of <300 nm to 3500 nm or more broader wavelength ranges), comprises, (i) an ohmic contact layer; (ii) a substrate; (iii) a first highly doped buffer layer, material-type same as the substrate; (iv) more than one micro-nano-scaled 3-D blocks, spaced with specific pitch or randomly arranged, each of block comprises with p-i-n structure or p-n structure, (a) doped layer either complete buffer layer and/or a portion of substrate layer (b) intrinsic (i-type) layer is formed using i-type InGaAs for absorption layer, grown on the top of the first doped layer; (c) a thin layer of second doped or lightly doped layer of InGaAs type on the top of absorption layer; (v) each 3-D block is separated by certain pitch or randomly arranged, (vi) the space between the 3-D blocks are filled or not filled by the insulator, (vii) a transparent layer of metal contact layer making the contact the top surface of the 3-d blocks, (viii) second metal contact, making common ohmic contact on the bottom part of the 3-D blocks, top of the thick doped layer, or on the top of the substrate, (ix) interconnection metal line (transparent or not) connecting each photodiode to the outside pad, wherein each photodiode formed by more than one 3-D blocks, is independently addressable, and; common ohmic metal contact layer on the backside of the substrate for all photodiodes in the array, wherein the light is illuminated surface (opening area) could be the circular, rectangular or square shaped, and they are designed in a way that light can be illuminated either from the top surface or from the bottom surface (substrate side).

According to the invention, the photodiode array comprises: N.times.N array of photodiode elements, wherein each photodiode element (having broad spectral ranges of <300 nm to 3500 nm or more broader), comprises, (i) an ohmic contact layer; (ii) a substrate; (iii) a first highly doped buffer layer, material-type same as the substrate; (iv) more than one micro-nano-scaled 3-D blocks, spaced with specific pitch or randomly arranged, each of block comprises with p-i-n structure or p-n structure, (a) doped layer either complete buffer layer and/or a portion of substrate layer (b) intrinsic (i-type) layer is formed using i-type InGaAs for absorption layer, grown on the top of the first doped layer; (c) a thin layer of second doped or lightly doped layer of InGaAs type on the top of absorption layer; (v) each 3-D block is separated by certain pitch or randomly arranged, (vi) the space between the 3-D blocks are filled or not filled by the insulator, (vii) a transparent layer of metal contact layer making the contact the top surface of the 3-d blocks, (viii) second metal contact, making common ohmic contact from the back side of the substrate, (ix) interconnection metal line (transparent or not) connecting each photodiode to the outside pad, wherein each photodiode formed by more than one 3-D blocks, is independently addressable, and; wherein second metal contact acting as the common ohmic metal contact layer for all photodiodes in the array, wherein the light is illuminated surface (opening area) could be the circular, rectangular or square shaped, and they are designed in a way that light can be illuminated either from the top surface or from the bottom surface (substrate side), According to the invention, the photodiode array comprises: (1) N×N array of photodiode elements, wherein each photodiode element (having broad spectral ranges of <300 nm to 3500 nm or more broader wavelength ranges), comprises, (i) an ohmic contact layer; (ii) a substrate; (iii) a first highly doped buffer layer, material-type same as the substrate; (iv) more than one micro-nano-scaled 3-D blocks, spaced with specific pitch or randomly arranged, each of block comprises with p-i-n structure or p-n structure, (a) doped layer either complete buffer layer and/or a portion of substrate layer (b) single or plurality layers of $InAs_yP_{1-y}$ type material of different y, where y is <1 but >0; (c) intrinsic (i-type) or lightly doped layer of InGaAs for absorption layer, grown on the top on the top of the singular or plurality layers of $InAs_yP_{1-y}$ type material; (d) a thin layer of second highly doped and/or lightly doped layer of InGaAs type as recessed layer or a thin layer of the etch stopper layer on the top of absorption layer; (v) each 3-D block is separated by certain pitch or randomly arranged, (vi) the space between the 3-D blocks are filled or not filled by the insulator, (vii) a transparent layer of metal contact layer making the contact the top surface of the 3-d blocks, (viii) second metal contact, making common ohmic contact on the bottom part of the 3-D blocks, top of the thick doped layer, or on the top of the substrate, (2) interconnection metal line (transparent or not) connecting each photodiode to the outside pad, wherein each photodiode formed by more than one 3-D blocks, is independently addressable, and; wherein second metal contact acting as the common ohmic metal contact layer for all photodiodes in the array, wherein the light is illuminated surface (opening area) could be the circular, rectangular or square shaped, and they are designed in a way that light can be illuminated either from the top surface or from the bottom surface (substrate side).

To avoid large resistance due to the abrupt junction formation, the gradual doping can be used in between intrinsic absorption layer and the second highly doped layer. A thin spacer-layer of type second layer can be used in between the second highly doped layer and intrinsic layer.

Alternately, a graded layer can be incorporated in the structure to reduce the minority carrier trapping at the InAsP/InGaAs band edge discontinuity.

According to the invention, the photodiode array comprises: (1) N×N array of photodiode elements, wherein each photodiode element (having broad spectral ranges of <300 nm to 3500 nm or more broader wavelength ranges), comprises, (i) an ohmic contact layer; (ii) a substrate; (iii) a first highly doped buffer layer, material-type same as the substrate; (iv) more than one micro-nano-scaled 3-D blocks, spaced with specific pitch or randomly arranged, each of block comprises with p-i-n structure or p-n structure, (a) doped layer either complete buffer layer and/or a portion of substrate layer (b) single or plurality layers of $InAs_yP_{1-y}$ type material of different y, where y is <1 but >0; (c) intrinsic (i-type) or lightly doped layer of InGaAs for absorption layer, grown on the top on the top of the singular or plurality layers of $InAs_yP_{1-y}$ type material; (d) a thin layer of second highly doped and/or lightly doped layer of InGaAs type as recessed layer or a thin layer of the etch stopper layer on the top of absorption layer; (v) each 3-D block is separated by certain pitch or randomly arranged, (vi) the space between the 3-D blocks are filled or not filled by the insulator, (vii) a transparent layer of metal contact layer making the contact the top surface of the 3-d blocks, (2) interconnection metal line (transparent or not) connecting each photodiode to the outside pad, and (3) second metal contact, making common ohmic contact made from the back-side of the substrate, wherein each photodiode formed by more than one 3-D blocks, is independently addressable, and; wherein second metal contact acting as the common ohmic metal contact layer for all photodiodes in the array, wherein the light is illuminated surface (opening area) could be the circular, rectangular or square shaped, and they are designed in a way that light can be illuminated either from the top surface or from the bottom surface (substrate side).

It is also an object of this invention to provide the interconnection scheme where metal connection connecting each photodiode element to the outside pad and this can be designed in a way that metal contacts of the photodiodes located one-fourth of the array are designed to align in two sides. Replica of this metal layout can be copied for metal contacts alignment for other photodiodes located in the three-fourth of the array.

According to the invention, the fabrication process of the photodetector comprises, (i) growing the layers forming the photodiode structure on the substrate; (ii) electron beam patterning, and subsequently dry etching for forming 3-D blocks up to the buffer layer or up to the substrate, (iii) filling the spaces opened in between 3-D blocks by insulator or the polymer material, (iv) formation of the bottom ohmic contact acting as the common electrode, (v) formation of the top ohmic contact; (vi) formation of the AR coating on the opening surface, and (vii) polishing the substrate and formation of the bottom ohmic contact, wherein top electrode can be transparent conducting layer, if the detector is top illuminated and wherein one detector can be composed of multiple 3-D blocks.

According to the invention, the fabrication process of the photodiode comprises, (i) growing the layers forming the photodiode structure on the substrate; (ii) electron beam patterning and dry-etching for forming 3-D blocks up to the buffer layer or up to the substrate; (iii) filling the spaces in between the 3-D blocks; (iv) forming top electrode; (v) etching the front portion on the surface down to the substrate; (vi) depositing the insulator and subsequent patterning to open front portion; (vii) forming the second electrode on the opened front portion; and, (viii) thin-out the substrate to open to the buffer layer, wherein the light is illuminated from the substrate side.

According to the invention, the fabrication process of the photodiode comprises, (i) growing silicon oxide on the substrate (like InP), (ii) patterning and subsequently dry-etching to open the area on the substrate, (iii) selective growing the detector structure (e.g. p-i-n structure) forming the photodiode structure on the substrate; (iv) electron beam patterning, and subsequently dry etching for forming 3-D blocks up to the buffer layer or up to the substrate, (v) filling the spaces opened in between 3-D blocks by insulator or the polymer material, (vi) formation of the bottom ohmic contact acting as the common electrode, (vii) formation of the top ohmic contact; (vii) formation of the AR coating on the opening surface, and (ix) polishing the substrate and formation of the bottom ohmic contact, wherein top electrode can be transparent conducting layer, if the detector is top illuminated and wherein one detector can be composed of multiple 3-D blocks.

According to the invention, the fabrication process of the photodiode comprises, (i) growing silicon oxide on the substrate (like InP), (ii) patterning and subsequently dry-etching to open the area on the substrate, (iii) selective growing the detector structure (e.g. p-i-n structure) forming the photodiode structure on the substrate; (iv) electron beam patterning and dry-etching for forming 3-D blocks up to the buffer layer or up to the substrate; (v) filling the spaces in between the 3-D blocks; (vi) forming top electrode; (vii) etching the front portion on the surface down to the substrate; (viii) depositing the insulator and subsequent patterning to open front portion; ix) forming the second electrode on the opened front portion; and, (x) thin-out the substrate to open to the buffer layer. wherein the light is illuminated from the substrate side.

According to this invention, the antireflection (AR) coating layer is to be compatible for the wavelength ranges to be detected to reduce the reflection loss. This AR coating could be the single layer or multiplayer combinations.

According to this invention, the p-i-n structure based 3-D block is mentioned. 3-D blocks of multiquantum well or quantum dots embedded 3-D blocks are also used.

According to this invention, it is also an object to make the nano scaled 3-D blocks which are cylindrical, trapezoidal, conical, cubical, pyramid, or rectangular in shapes.

According to this invention it is an object to make the detector or sensor pixel which can be flip-chip bonding with the integrated circuit or transfer the structure sensor structure to the independent substrate.

According to this invention, it is an object to make the detector or sensor pixel is not only to make the broadband, but also to absorb all light by trapping inside to increase the sensitivity and at the same time reduce the dark current.

According to this invention, in order to avoid large resistance due to the abrupt junction formation, the gradual doping can be used in between intrinsic absorption layer and the second highly doped InP or InGaAs layer. A thin layer of spacer layer of InP or InGaAs type can be used in between the second highly doped InP or InGaAs layer and InGaAs absorption layer.

According to this invention, each nano-scaled 3-D block having the structure comprising, structure is alternative made using (a) a single or plurality layers of highly doped buffer layers; (b) intrinsic layer of InGaAs for absorption layer, fabricated on the top of the first doped layer; (c) a thin layer of lightly doped InGaAs or InP type on the top of absorption layer; (d) a thick layer of doped InGaAs or InP layer which is etched up to the top of the highly doped buffer layer or up to the substrate to isolate each 3-D block from each other and can be operated independently.

According to this invention, the interconnection of each photodiode element comprising with multiple nano-scaled blocks, connecting to the outside is done by upside down the whole array structure and bonded each photodiode element to the metal pads located on the independent substrate. The light is incident from the backside of the etched substrate.

According to the invention, AR coating is also used on the top of the thin high doped InP or InGaAs after the etching the bottom side of the InP substrate.

According to this invention, the antireflection (AR) coating layer is to be compatible for the wavelength ranges to be detected to reduce the reflection loss. This AR coating could be the single layer or multiplayer combinations.

It is also an object to transfer the 3-D blocks to the third substrate to make the broadband image sensor made from the different material systems and operated on the common substrate after transferring.

According to this invention, the antireflection (AR) coating layer is to be compatible for the wavelength ranges to be detected to reduce the reflection loss. This AR coating could be the single layer or multiplayer combinations.

It is an object of this invention to provide the bonding technique of the single photodiode and photodiode array on the carrier on which the logic circuit is bonded or monolithically fabricated.

According to this invention the bonding process of the bottom incident photodiode having broad spectral detection ranges (covering from <300 nm to 3500 nm and also <300 nm to 5500 nm) comprises the bonding of the upside down photodiode (and array) to the carrier wherein the same number pads as that of the photodiode array are present for electrical connections. The detector array is bonded by the flip-chip bonding technique using the solder bumps in between the contacts.

According to these inventions, the detector array having the metal line connecting each contact to the outside pads can be connected with the pads to carrier pads by flip-chip bonding.

According to this invention, the detector having the contacts itself as the pads can be directly bonded with the pads on the carrier, layout designed compatible for the detector array.

According to this invention, the detector array previously described having the quartz or semiconductor for making easiness of etching of substrate, can also be bonded on the carrier having the logic circuit using the flip-chip bonding. The difference here is that the carrier is designed with groove to fit the quartz or semiconductor attached on the photodiode array. The high thermal conductive epoxy can be used in the space between the groove and quartz or semiconductor.

According to this invention, the substrate could be InP or GaAs, and absorption layer is InGaAs or InGaP with thickness appropriate to get broad ranges of the spectral responses (from <300 nm to 1700 nm) in bulk case, and extending this spectral response to mid-IR utilizing the nano-scaled 3-D blocks According to this invention, the interface between the InP and InGaAs can be made smooth junction using the grading layer in between.

The invention offers to detect broad detection ranges varying from UV to mid infrared as high as 5500 nm with high quantum efficiency, high frequency response, and low signal-to-noise ratio. With proper design and fabrication process, N×N photodiodes array can be fabricated with capability of independently addressable each photodiode. The photodiode array will have the CCD like feature with broad spectral detection capability. The signal processing circuit can also be integrated monolithically or hybrid. These inventions could be easily implementable as today's manufacturing technology can be used. The detector mentioned in this invention will be used for multiple purpose optical detection for many applications.

Another advantage of this invention is that conventional material and IC fabrication technology can be usable to fabricate this photodiode and its array.

Other objects, features, and advantages of the present invention will be apparent from the accompanying drawings and from the detailed description that follows below.

BRIEF DESCRIPTION OF THE DRAWINGS

The invention will be explained in more detail in conjunction with the appended drawings wherein:

FIGS. 6C-6I are schematics of various embodiments that incorporate a buffer layer, where each figures exemplifies a different way the buffer layer can be incorporated.

FIGS. 7A and 7B are the schematics showing the cross-sectional views of alternatives detector elements for the top-illuminated element and bottom illuminated diode in accordance to the present invention.

FIGS. 8A and 8B are the schematics showing the cross-sectional views of detector-array for the top-illuminated diodes and FIG. 8C is the schematic showing the cross-sectional view of the bottom-illuminated detector array, in accordance to the present invention.

FIGS. 9A to 9E are the schematics showing the cross-sectional views of the fabrication process for the top-illuminated detector element in accordance to the present invention.

FIGS. 10A to 10E are the schematics showing the cross-sectional views of alternative fabrication process for the top-illuminated detector in accordance to the present invention.

FIGS. 11A to 11D are the schematics showing the cross-sectional views of alternative fabrication process for the top-illuminated photodiode array in accordance to the present invention.

DESCRIPTION OF THE PREFERRED EMBODIMENTS

Figure 1A:
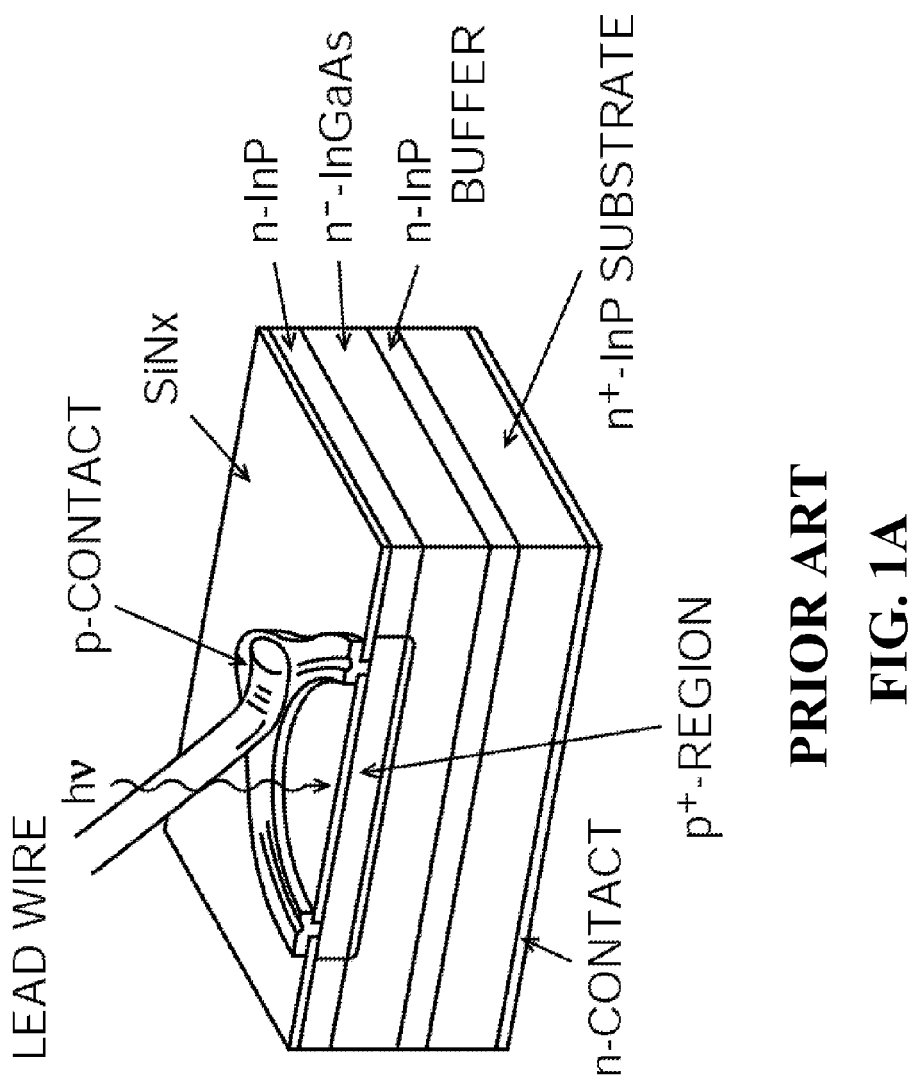
FIGS. 1A and 1B are the schematics showing the cross-sectional views of photodiode structures. These are the explanatory diagrams showing the prior-art of today's photodetector element.

The best modes for carrying out the present invention will be described in terms with reference to the accompanying drawings. In the following description, the same reference numerals denote components having substantially the same functions and arrangements, and duplicate explanation will be made only where necessary.

Here the structure and design we mention are for both top (also mentioned as 'front')-illuminated and bottom (also mentioned as 'back')-illuminated type detector and their array having broad spectral detection ranges. The main objective of this invention is to make the broad spectral detector and their array using the InGaAs using the InP substrate. This covers all photodiode and their array with broad spectral detection ranges from <300 nm to 3500 nm and also over, which uses the InGaAs as the absorption layer.

With changing the diode structure, spectral response is broadened as compared to its bulk material based photodiode. Similar diode structure can also be used for other diode made from GaAs, Si, InP, InGaAs, SiGe, or HgCdTe based material system.

Figure 1B:
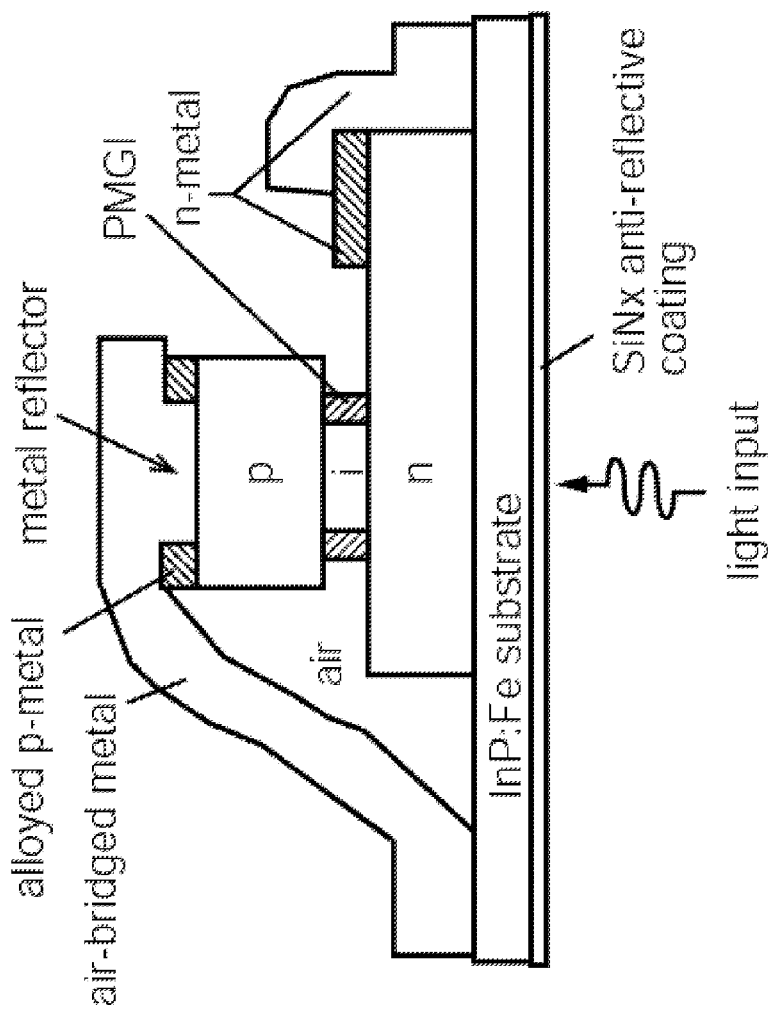

Diode made from Indium phosphide (InP) based photodiodes especially of p-i-n type has been studied extensively over the last decade for its application in optical communication. These photodiodes are based on the structure and material system, which can detect the wavelengths covering from 1000 nm to 1600 nm. FIGS. 1A and 1B shows a cross-sectional view of prior art of photodiodes of top-illuminated and bottom-illuminated types. In most cases a thin layer of InGaAs acting as the absorption region, is sandwiched between two layers of doped InP, forming bulk p-i-n structure. These two materials (InGaAs and InP) combination used in the photodiode determine mainly photodiode's spectral detection region. In addition, the dark-current (a.k.a noise) is mainly dependent on to the material type and growth and usually with increasing of the area of the diode, the dark-current (signal-to-noise ratio) increase at the fixed bias voltage. Details of the prior art photodiode can be found in the chapter written by K. Taguchi, in the book, entitled "WDM Technologies: Active Optical Components" (Editor: A. K Dutta), published by Academic Press, Boston, Mass.

Figure 2A:
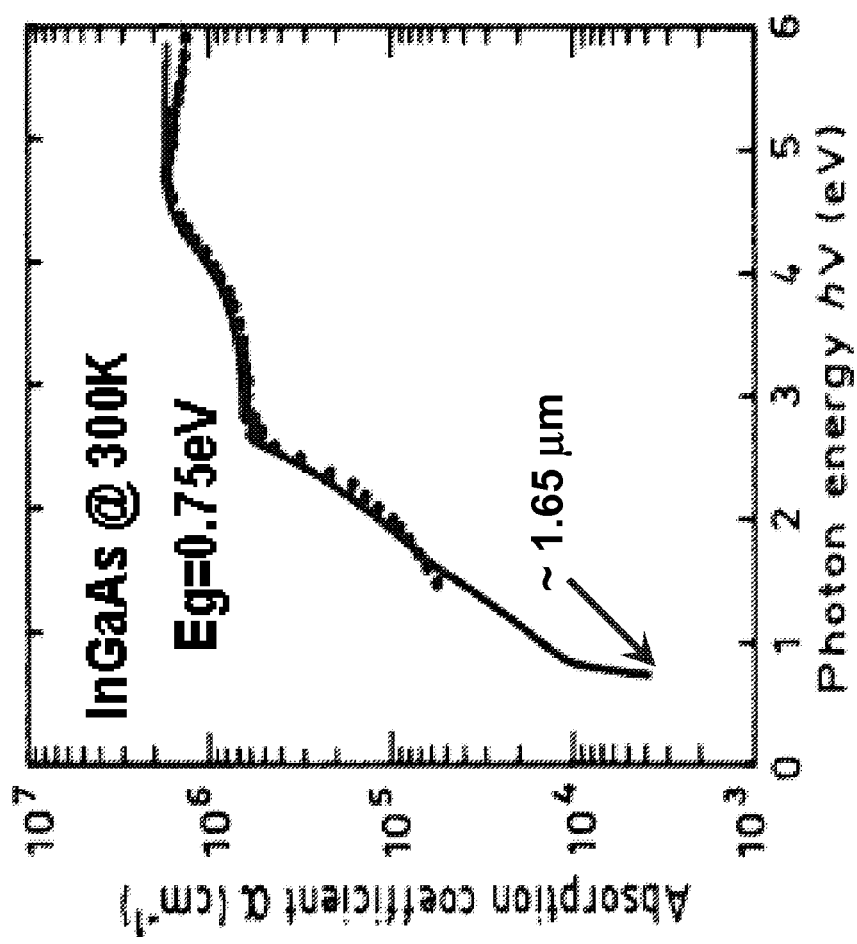
FIGS. 2A and 2B are the absorption spectra of the bulk InP and bulk InGaAs material systems.
Figure 2B:
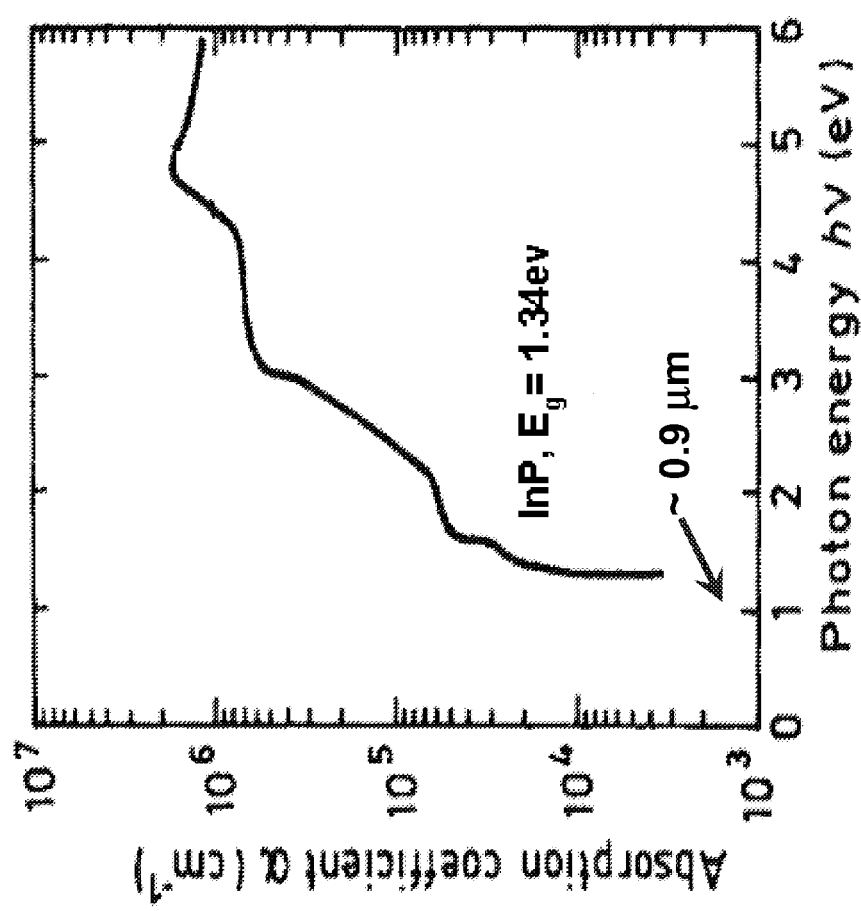
Figure 3A:
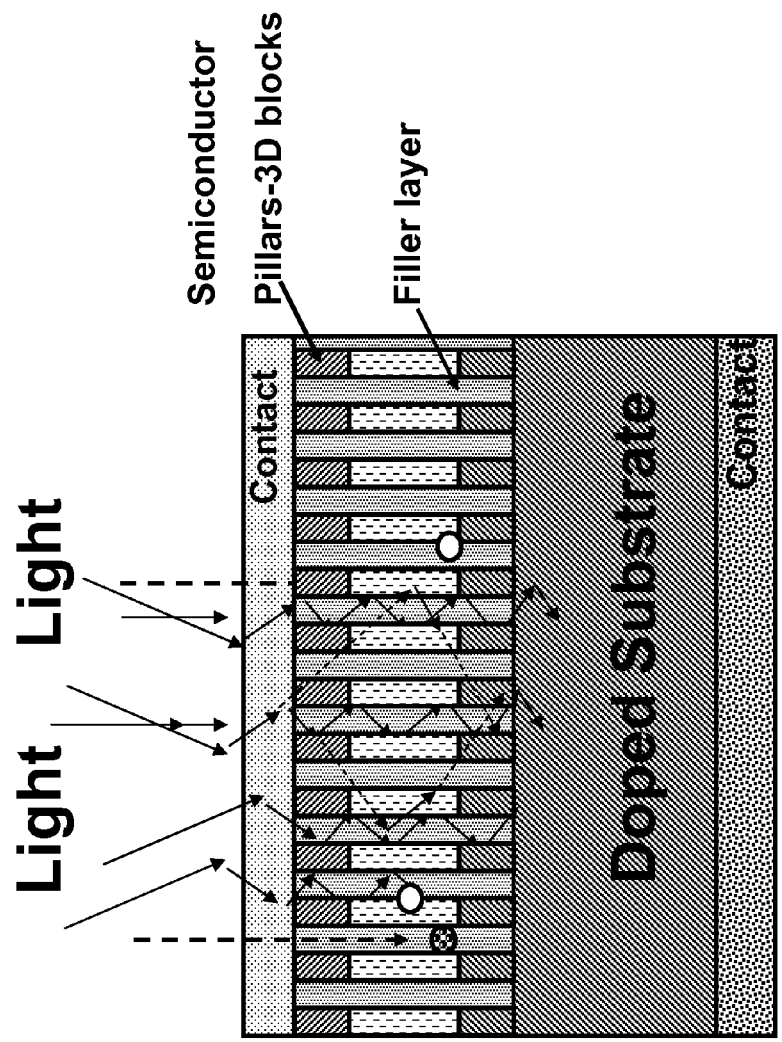
FIG. 3 is the schematic showing the cross-sectional view of a top-illuminated broadband detector or sensor pixel (single element) in accordance to the present invention.
Figure 3B:
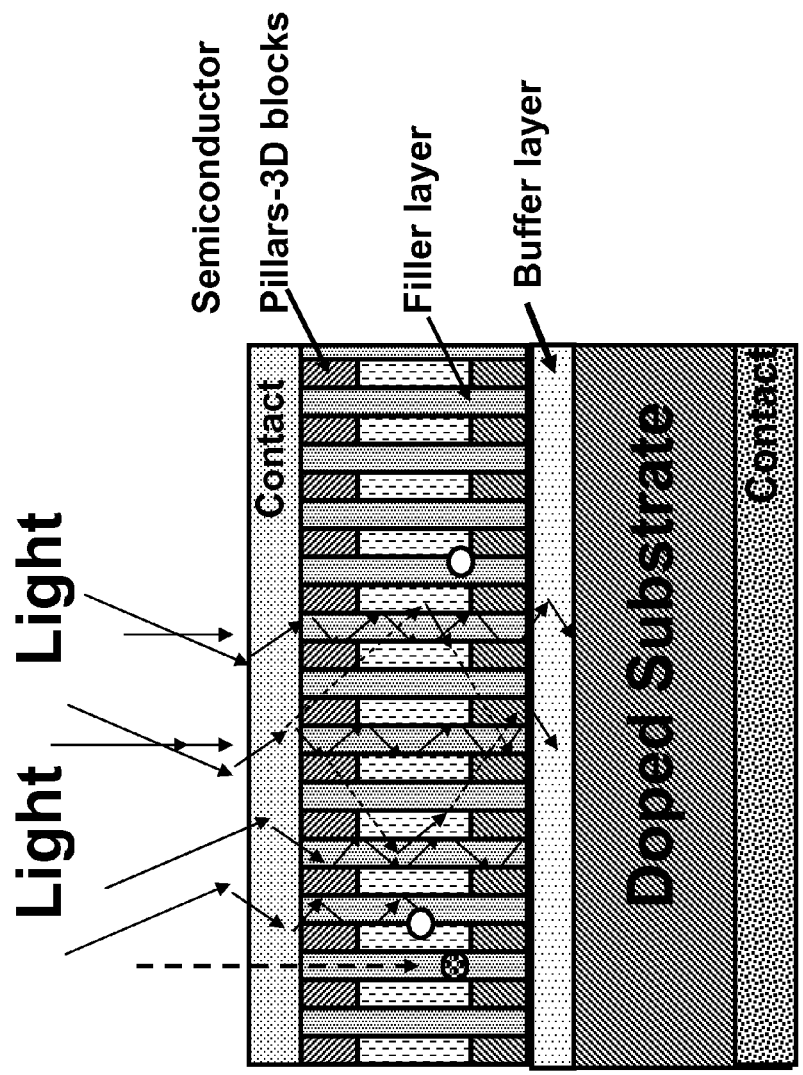
Figure 3C:
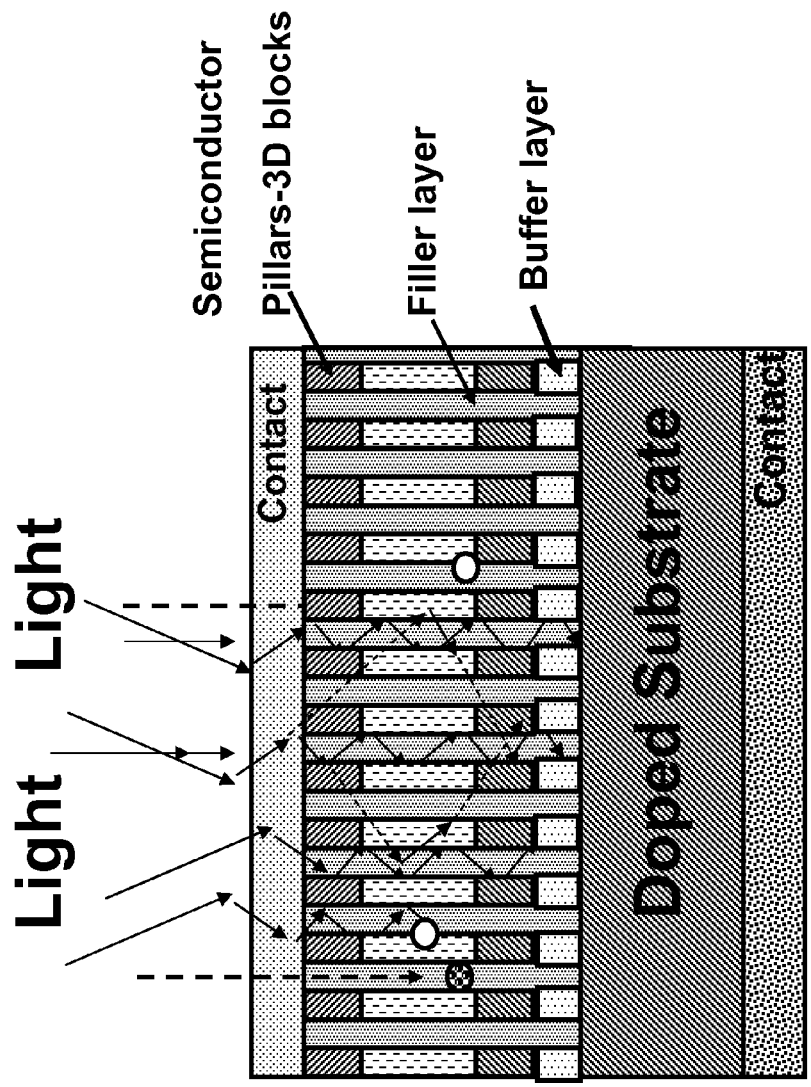
Figure 3D:
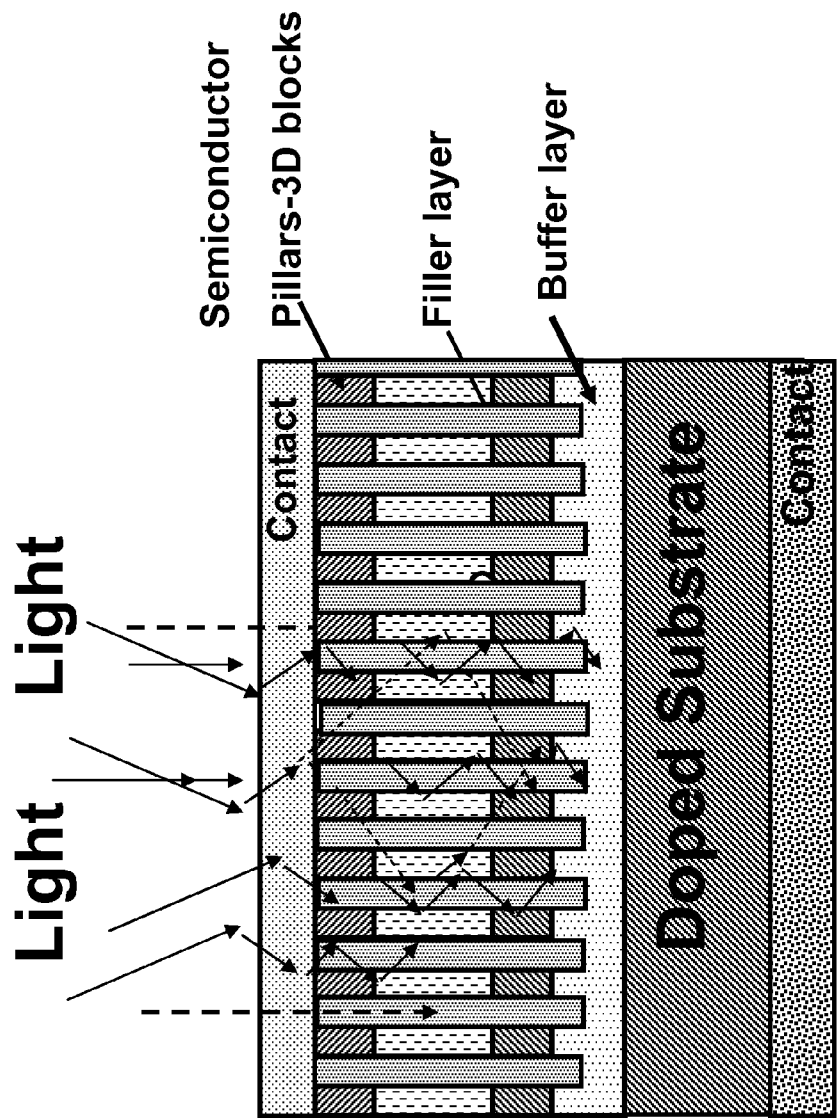

The absorption spectra of InGaAs (lattice matched to InP) and InP materials are shown in FIGS. 2A and 2B. The bandgaps of InGaAs and InP are 0.75 eV and 1.34 eV, which correspond to wavelengths of .about.1650 nm and .about.950 nm, respectively. The absorption coefficient of these material increases with increasing of photon energy. Any photodiode made using InGaAs as the active absorption layer is expected to absorb all the wavelengths from UV (ultraviolet) to 1650 nm unless some photons are selectively blocked.

After carefully looking at FIGS. 1 and 2, one can understand why conventional device structure as shown in FIGS. 1A and 1B cannot respond to any photon with a wavelength below 1000 nm and also over 1700 nm. The reason is that the InP contact layer absorbs the light of wavelengths below 980 nm and InGaAs has no or less absorbtion after 1700 nm. Any photon absorption in doped InP contact layers doesn't generate any electrical response in the device (if carrier diffusion is neglected). Thus, prior art photodiodes based on InP based diode in prior art can respond only 980 nm to 1700 nm, and with changing the InGaAs material contents, the spectral response can be achieved from 980 nm to 2500 nm. With changing of the InP by the other InP based material, the diode spectral response can be extended to near UV, especially <300 nm to 1700 nm, and the development work of the diode is published in the paper published in SPIE conference proceeding 6014, paper 60140C-1, 2005 by Achyut Dutta et. al. However, in this case also, the spectral detection range is only limited in between 300 nm to 1700 nm which is near UV (or UV) to shortwave-infrared (SW-IR). It is highly desirable to have diode having spectral range extending from UV to Mid-Infrared (Mid-IR) without changing the material system.

In the prior art (not shown here), a wafer bonding technique (not shown) is also usually used to design a photodetector with wide spectral response. In such devices, longer wavelengths are absorbed by a device structure shown in FIG. 1, while shorter wavelengths are detected by a Silicon photodiode, wafer bonded to an InP based structure. As the linear thermal expansion coefficient (TEC) of InP and Si are 4.60× $10^{-6}$ C$^{-1}$, and 2.6×$10^{-6}$C$^{-1}$, respectively, the TEC mismatches cause stress in a wafer-bonded structure in wide temperature ranges operation. In addition, making an array with a wafer bonded structure poses a great challenge in designing interconnect with the aim of addressing individual pixels.

Figures 4A, 4B, 4C:
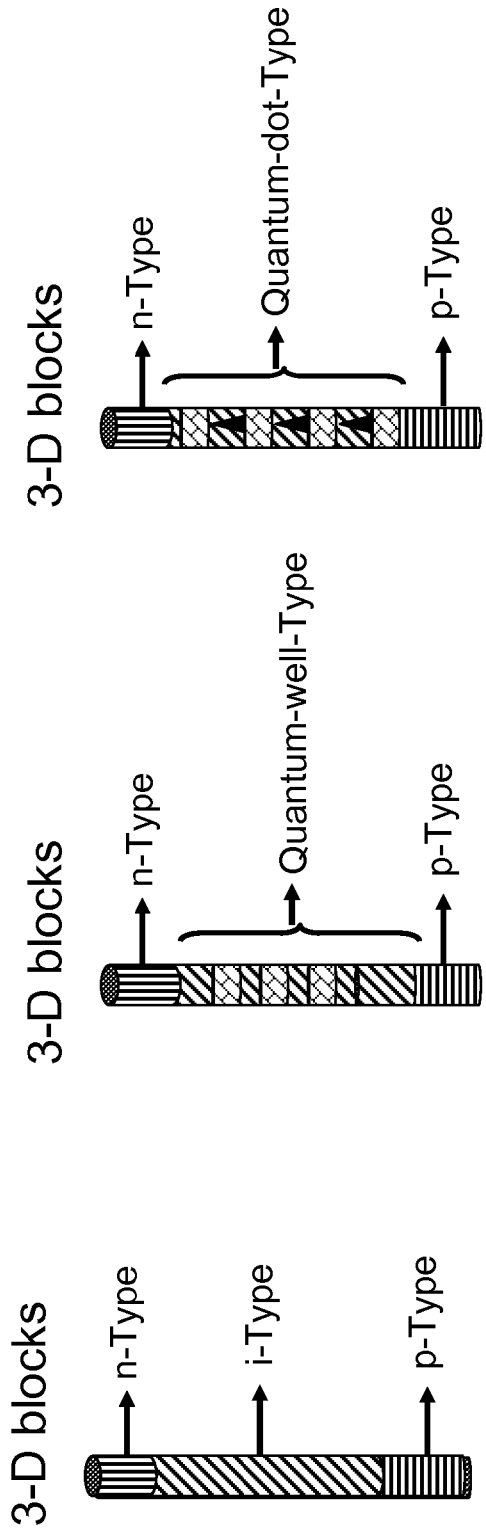
FIG. 4A to FIG. 4C are the schematics showing the cross-sectional vies of the nano-scaled 3-D blocks using in the detector accordance to the present invention.

According to this invention, example of the diode structure as shown in FIG. 3, comprises with multiple nano-scaled 3-D blocks, receiving all of the light and but absorbing the light with higher wavelengths capability of the macro-bulk material. If the 3-D blocks have InGaAs (lattice matched to InP) as a absorption layer (not shown here), and a ohmic contact layers which do not absorb significant number of photons. The figure is split into several variations, wherein the buffer layer is shaped in several different ways. In FIG. 3A the buffer layer is absent. In FIG. 3B the buffer layer is a continuous layer disposed on the substrate. In FIG. 3C the buffer layer is a part of each individual layer. In FIG. 3D the buffer layer is a combination, being both part of each individual pillar and also extending along the substrate. Furthermore, each 3-D blocks, as shown in FIGS. 4A to 4C, can be p-i-n structure or p-n structure which are bulk material, multiquntum well structure, or quantum dot embedded type structure. Alternatively, the photodiode structure can be only photo-conducting layer in the pillars with two contact layers at top and bottom of the pillars for making the ohmic contacts, wherein the photo-conducting layer is the low-doped p-or n-type of similar semiconductor material-type (p or n-type). The photodiode can be used in wide spectral regions covering from near UV (or UV) to 2500 nm, UV to 3500 nm or, from UV to >5000 nm. In the presence invention, the photodiode structures are mentioned which could have broad spectral range detection varying from UV to 3500 nm and also UV to 5500 nm with high quantum efficiency, low drak-current (signal to noise ration) and high frequency response. The detector can also be used for wide range of detection where InGaAs absorb. For example from 250 nm to 3500 nm spectral detection and also higher wavelengths, can be possible using the photodetector mentioned here. For the sake of understanding, we explain separately the photodetectors (and their arrays) having the <300 nm to over 200 nm (e.g. up to 3500 nm) detection ranges and <300 nm to 5500 nm detection ranges. Also we explain the top-illuminated photodetector (photodetector on which light is illuminated from the top) and bottom-illuminated (photodetector on which light is illuminated from the bottom (substrate side)) type both detectors and their process.

Figure 5:
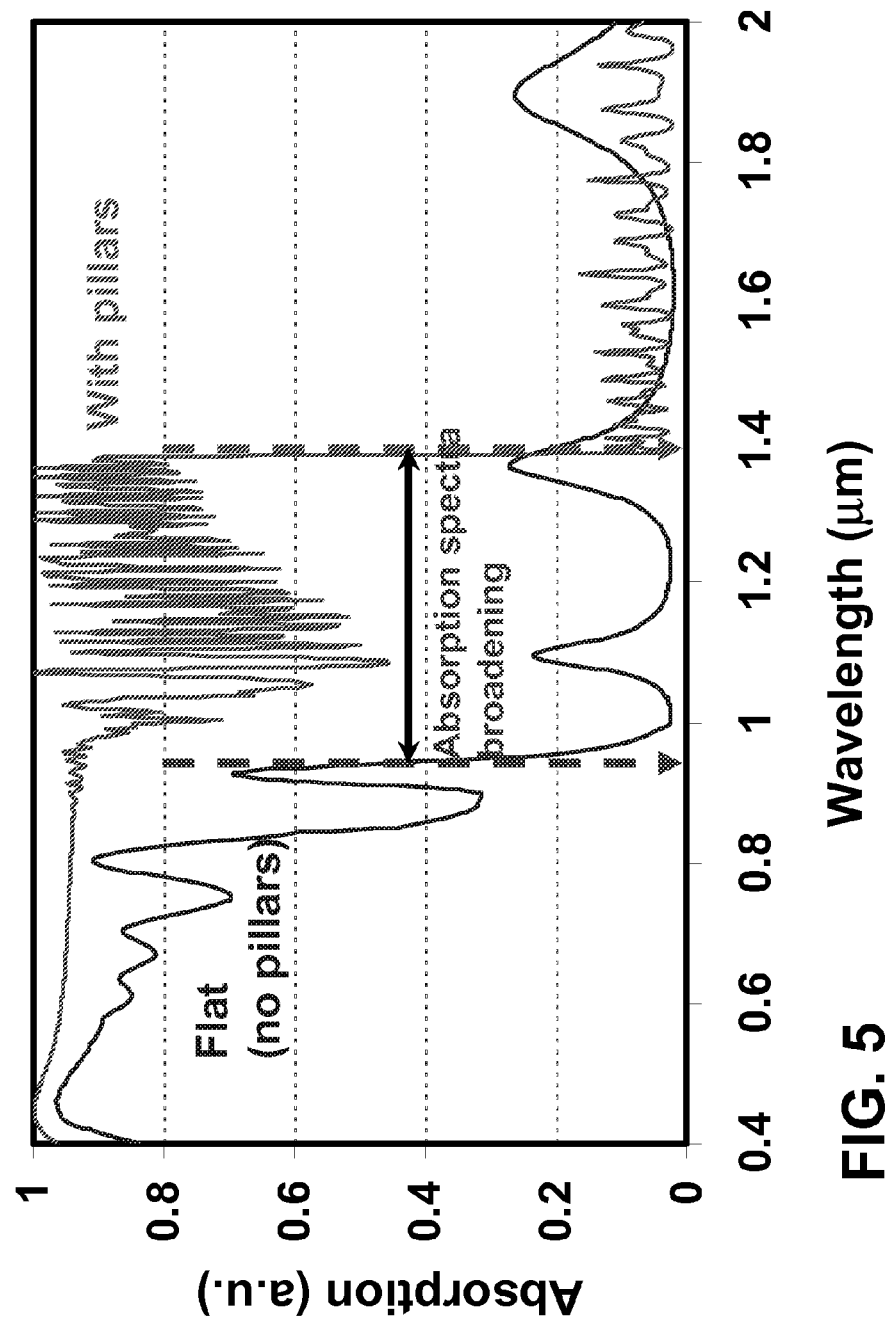
FIG. 5 shows the results of the 3-D blocks optical performance in according to this invention.

FIG. 5 shows the simulation results of the detector comprising with 3-D blocks according to the invention. The detector comprise with n-number of 3-D blocks of 0.2 μm diameter and arranged in array having 0.2 μm space in between the 3-D blocks. Each 3-D block consists of the p-i-n structure having InP absorption layer. Light from UV to 1.5 μm is illuminated on the 3-D blocks. It is known that InP has the sharp edge at the wavelength vicinity to 0.9 μm. It is seen in FIG. 5 that the spectral absorption range has been extended from 0.9 to close to 1.4 μm. This is possible using of the 3-D blocks which helps to extend the absorption spectra. Further broadening of the wavelength more than 2 μm is also expected if the pillar (3-D blocks) diameter is below 0.1 μm. In addition, the absorption at lower wavelength is also seen to be increased due to the minimizing the reflection, as compared with the flat surface.

According to this invention, the detector having the nano-scaled 3-D blocks and fabricated using any material systems such as Si, Ge, SiGe, InP, GaAs, GaN, InGaAs, HgCdTe, or PbS, the wavelength can be tremendously extended and increase the quantum efficiency, speed, and also sensitivity of the detector.

For the purpose of an example but not for the limitation, the detector can be also made from the micro-nano scaled 3-D blocks and junction can also be made from al over the surface to collect the carrier. Also alternatively, the junction can be made vertically in the 3-D blocks.

Figure 6A:
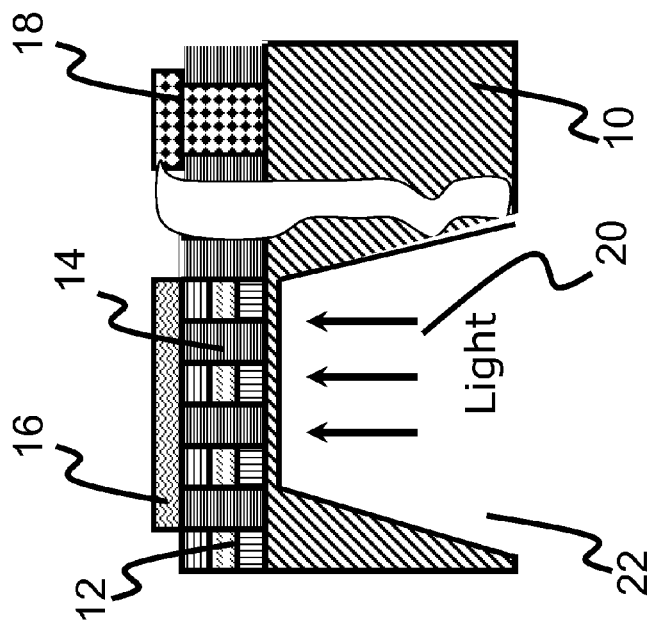
FIGS. 6A and 6B are the schematics showing the cross-sectional views of the detector element for the top-illuminated element and bottom illuminated diode in accordance to the present invention.
Figure 6B:
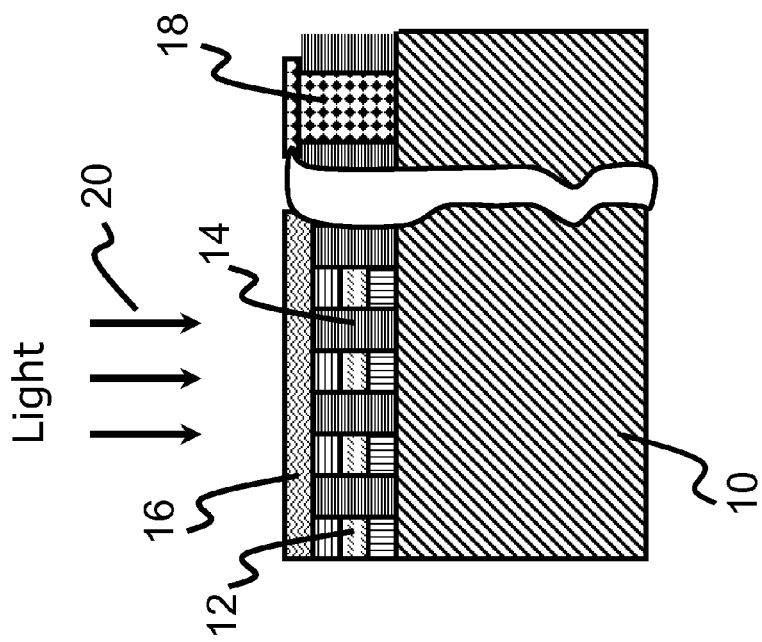
Figure 6F:
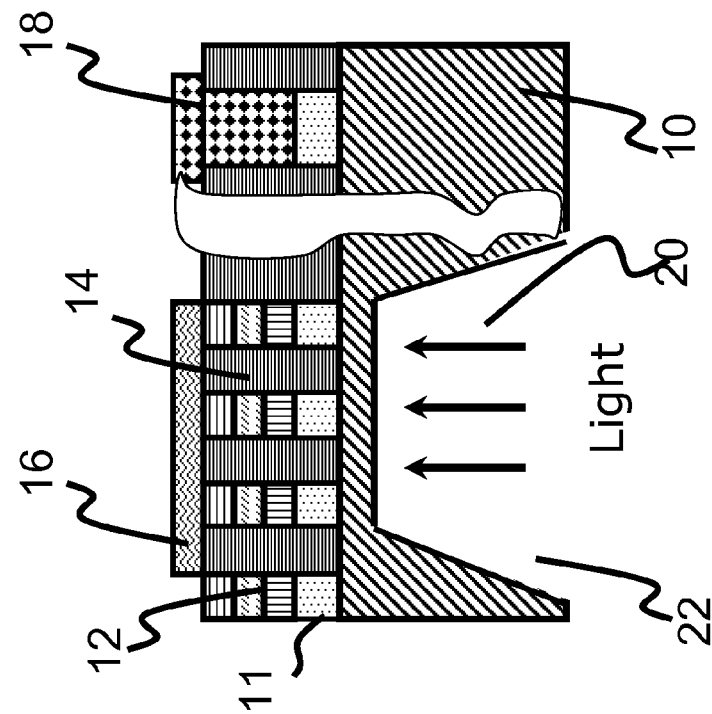
Figure 6E:
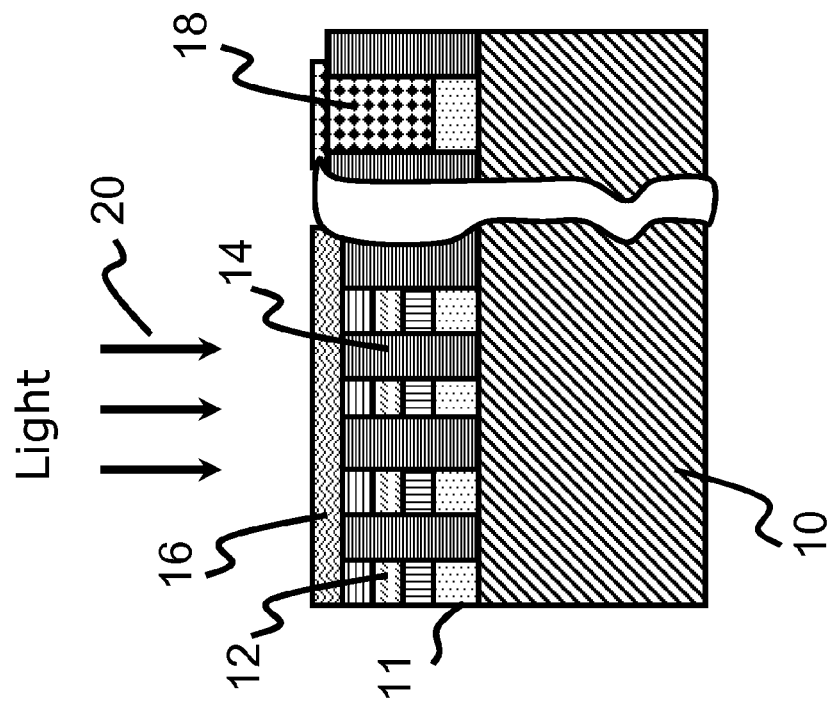

FIGS. 6A and 6B show the schematics showing the cross-sectional views of the top-illuminated and bottom-illuminated detectors having wide spectral detection ranges in accordance to the present invention, wherein the same numerals are the same parts so that repeated explanation is omitted here. FIGS. 6C-6I show alternate embodiments showing the buffer layer 11 placed between the substrate and the pillars. This buffer layer may be a single layer, a graded layer, a plurality of single layers, a plurality of graded layers, or a combination. FIGS. 6C, 6E, and 6G show top-illuminated detectors where the buffer layer is a continuous layer on the substrate, part of the pillars, or a combination. FIGS. 6D, 6F, 6H, and 6I show bottom-illuminated detectors with the same three variations of buffer layer. For the bottom-illuminated detector, the substrate may be etched out even more completely than shown. For example, the buffer might also be partially or completely etched out as shown in FIG. 6I.

Photodiode structure as shown in FIGS. 6A and 6B, consists of n-type InP substrate 10, multiple nano-scaled 3-D blocks 12 separated by certain pitch or randomly arranged, spacer layer 14 in between the 3-D blocks 12, two metal contacts 16 and 18 connecting to the p and n layer and making ohmic contacts. Broadband lights 20 are illuminated to detector from the top side for the top-illuminated detector (FIG. 6A) and from the bottom side for the bottom-illuminated detector (FIG. 6B).

FIGS. 7A and 7B show the schematics showing the cross-sectional views of the top-illuminated and bottom-illuminated detectors having wide spectral detection ranges in accordance to the present invention, wherein the same numerals are the same parts so that repeated explanation is omitted here. Only difference with FIGS. 6A and 6B is that, in both top- and bottom-illuminated type detector, substrate 10A is thinned out prior to the process and attached the foreign carrier substrate 24 (e.g. metal or glass) to the thinned substrate 10A using the adhesive 26. The foreign substrate either takes out or remains with the thinned substrate after the detector is made.

For the purpose of an example but not for the limitation, the substrate can be n-type InP and n+ and low doped $InAs_yP_{1-y}$ buffer layers (not shown here), $InAs_{0.6}P_{0.4}$, $In_{0.8}Ga_{0.2}As$ layer as absorption layer, highly doped $InAs._{0.6}P_{0.4}$ layer for ohmic contact.

Photodiode has the n type ohmic contacts at the backside of the substrate 10 or the n-type contact 18 can be taken on the top for making easiness in bonding, and p type of ohmic contact 16 at the top of the photodiode. Single photodiode can be formed having multiple 3-D blocks and they are separated by the spacer 14 which are selected from the group consisting of semiconductor, polymer, silicon-oxide, silicon nitride, having no or less absorption of the wavelengths to be detected. For the bottom-illuminated detector, substrate is thinned out to make the opening portion 22, to reduce the absorption of the light due to the substrate. For the top-illuminated type detector, the area of the top contact (in this case p-type contact) determines the detector size (or pixel size). For the bottom illuminated type detector, top contacting area determines the area of the detector for single detector case. The details of this fabrication process will be explained later section. Based on the 3-D blocks size and width of detector, the absorption broadening and the sensitivity can be designed. Using the nano-imprint (not shown), however, the width can be reduced to nanoscale level and incident surface area can be increased, and also the pixel size can be reduced.

According to this invention, the graded composition is used in between the $In_{0.8}Ga_{0.2}As$ 15 and InP substrate 10 to reduce the dark current. The absorption layer $In_{0.8}Ga_{0.2}As$ 15 could be intrinsic or slightly n doped layer. As the top ohmic contact layer, InGaAs or InP layer can be used. In the case of InP layer, the thickness is needed to be thin enough to reduce the absorption of the light in the shorter wavelength regions.

According to this invention, $InAs_{0.6}P_{0.4}$ layers are used as the contact layer. If high doping of $InAs_{0.6}P_{0.4}$ appropriate for ohmic contact is not possible, a thin layer of highly doped InGaAs layer (not shown) can be used on the $InAs_{0.6}P_{0.4}$ layer.

The absorption layer thickness could be 1 to 4 μm to increase the quantum efficiency with compromising with the frequency response. It is estimated that the photodiode with thick absorption layer of 3.5 μm $Ga_{0.47}In_{0.53}As$ that ensures a quantum efficiency (QE) of more than 90% over the wavelength and much higher QE for shorter wavelengths.

In the preferred embodiment as shown in FIGS. 6A, 6B, 7A, and 7B, the photodiodes shape is square, rectangular, circular or ellipsometric, as necessary for the specific application. With using the similar approach, bottom incident type photodiode can also be designed. For using of the highly p++doped InGaAs layer, $In_{0.47}Ga_{0.53}As$ type with highly doped p− can be used. The p-ohmic contact is a thin ohmic contact on a highly doped InGaAs layer with a dopant concentration of >$10^{20}/cm^3$. The frequency response of the structure is estimated to be 10 GHz at 3 dB. The capacitance of the device is in the sub femto-Farad range due to the small junction area, and thick absorption layer.

Alternatively, highly p-doped InP layer can also be used instead of highly p-doped $In_{0.47}Ga_{0.53}As$ on the top of the InGaAs absorption layer. The layer is to be made to thin to about 10 nm to suppress the InP absorption for the shorter wavelength light.

Each photodiode can have the junction area of below 5×5 μm$^2$ or more. On single substrate, photodiode array of N×N is made, and each photodiode element is separated by top contacts 16 and the spacer 14 to isolate from other detector element.

FIGS. 8A and 8B are the schematics showing the top illuminated type detector array and FIG. 8C is the schematic showing the cross-sectional view of the bottom-illuminated type detector array on the same wafer, in accordance to the present invention, wherein the same numerals are the same parts, as shown in FIGS. 6A, 6B, 7A, and 7B, so that repeated explanation is omitted here. The broadband detector array is expected to offer high quantum efficiency, high speed >10 GHz at 3 dB (considering the parasitic of metal line), and also can be used in a wide range of temperatures and wavelengths. Each detector element of the array can also be rapidly and randomly addressed based on the metal connection scheme (not shown here). The metal connection can be made using the standard photolithography technique. The advantage of this photodiode array including metal connection is that it can be fabricated using the less process step than conventional CCD. Alternatively, each photodiode is also bonded.

FIGS. 9A to 9E are the schematics showing the fabrication process of the single detector element in accordance to the present invention wherein the same parts are represented by the same numerals so that repeated explanation is omitted here. This fabrication process described here is only for an example. Every material system can be used for making the detector element utilizing other material system. For making the detector structure 28, the required buffer InP layer, absorption layer InGaAs, and high doped InGaAs layer (not shown here) are deposited on the substrate 10 using standard deposition techniques such as metal-organic chemical vapor deposition, or molecular beam epitaxial technique etc. Noted here that, required spacer layer (not shown either) avoiding the doping diffusion into the absorption layer may require. Patterning and subsequent dry etching would make the micro-nano-scaled 3-D blocks 12, and space 30. Patterning can be made utilizing either Electron-beam patterning or nano-imprinting utilizing the master mold. Dry etching technique is used to make the 3-D blocks. Standard resist or any mask material can be used in dry etching process. This is followed by the filling the space by insulator or semiconducting material of opposite type. Standard polymer (or monomer) material having less or no absorption of wavelengths of interest can be used. Silicon oxide or silicon nitride utilizing the chemical vapor deposition can also be used as the filler material. Sol-gel silicon oxide can also be used alternatively. Metallization for bottom and top ohmic contacts 18 and 16 are made. This is followed by formation of the AR coating (not shown here) on the front surface.

Alternatively, wet-etching (not shown here) is done to open the contact area for the bottom contact. After depositing the filler (spacer) material, thickness same as the height of the 3-d blocks, patterning and wet-etching is done to open the contact area (from the top) and subsequently metallization of the bottom electrode. This is followed by the patterning and metallization for the top e-electrode. Other process is the same as mentioned earlier.

According to this invention, top electrode metal can be transparent over the wavelength of interest. Indium-tin-oxide can be used as the top-contact metal. If the non-transparent metal is used as the top metal contact for the top-illuminated detector, then thinner Ni:Cr is used as the top contact metal. This can be followed by the metallization to make the ring shaped metal contact for bonding purpose.

Alternatively, according to this invention thinner substrate 10A (not shown in process flow) is used to fabricate the detector element. Substrate is thinned out using thin-cut process. Other process such as the laser cutting or polishing technique can be used for this purpose. Both laser cutting and thin-cut process help to utilize the remainder of the substrate for other detector element and reduce the manufacturing cost of the proposed detector.

Alternatively, nano-pillar as the 3-D block is used instead of the p-i-n structure based 3-D blocks, described in FIGS. 9. In this case, p-n junction (not shown in FIG. 9) is made using either different type (p or n-type) material, grown following the pillar formation. In this case p-n junction is formed all over the surface of the pillar. Planarizartion and metallization process are the same as described in FIGS. 9, so that repeated explanation is omitted here.

FIGS. 10A to 10E are the schematics showing alternative fabrication process of the single detector element in accordance to the present invention wherein the same parts are represented by the same numerals so that repeated explanation is omitted here. This fabrication process described here is only for an example. Thin substrate 10A is used, attaching with the foreign substrate 24. Thicker substrate 10 can be also used without attaching with the foreign substrate. The differences between FIGS. 9 and 10 are that, silicon oxide is deposited on the substrate (like InP, GaN, Si, SiC, InGaAs, GaSb, SiGe, or GaAs). The silicon oxide is patterned and dry-etched to make the pillars 32 of high aspect ratio and the space 34 in between the pillars. Patterning can be made utilizing either Electron-beam patterning or nano-imprinting utilizing the master mold. Dry etching technique is used to make the 3-D blocks. Standard resist or any mask material can be used in dry etching process. Detector structure 28 is selectively grown into the space 34. This is followed by formation of the common bottom metal contact. Epitaxial growing the detector structure 28, would make the micro-nano-scaled 3-D blocks 12. Planarization is done before or after the metallization. The top contact is done after the bottom metallization. Either metallization process can be done alternatively. This is followed by formation of the AR coating (not shown here) on the front surface.

Alternatively, gold nano-particle (not shown here) is placed in the space 34, acting as the catalyst, and crystal nano-pillars are grown in the space 34. p-i-n structure can be created while nano-pillars are grown. Alternatively, single type (e.g. n-type doped) semiconductor is grown in the space 34, and opposite type (p-type doped layer) semiconductor layer is formed all over the surface to make the p-n junction. Other process is similar as explained in earlier. Alternatively, instead of growing opposite type semiconductor layer, dopant can be diffused to make the opposite semiconductor type for p-n junction.

FIGS. 11A to 11D are the schematics showing alternative fabrication process of the single detector element in accordance to the present invention wherein the same parts are represented by the same numerals so that repeated explanation is omitted here. This fabrication process described here is only for an example. Thin substrate 10A is used, attaching with the foreign substrate 24. Thicker substrate 10 can be also used without attaching with the foreign substrate. The differences between FIGS. 10 and 11 are that, silicon oxide is patterned and dry-etched to make the pillars 36 of high aspect ratio and the space 38 in between the pillars. The space 38 determines the size of the detector. Patterning is done using the standard photolithography technique. Other patterning technique such as Electron-beam patterning or nano-imprinting utilizing the master mold can also be used. Dry etching technique is used to make the pillar 36. Standard resist or any mask material can be used in dry etching process. Detector structure 28 is selectively grown into the space 38. This is followed by the EB-patterning and dry-etching to make the 3-D pillars 12. Planarization and metallization for both top and bottom contacts) followed thereafter. This is followed by formation of the AR coating (not shown here) on the front surface.

According to this invention, bottom-illuminated type detector (not shown here) is also made using the same process mentioned earlier. Only differences are that substrate thinning out is necessary in order to avoid any absorption due to the substrate material.

In preferred embodiments, detector element and its process flow is described. Detector array of top-illuminated type or bottom-illuminated type are also fabricated using the same process. Only differences are that array of detectors are fabricated onto the same substrate. Either each detector is connected to the outside world by using the metal line from detector to outside pad or detector is bonded directly onto the integrated circuit. Former case can be compatible to both top and bottom-illuminated type detector array. The later case is only compatible to the bottom-illuminated type detector array.

In the preferred embodiment, photodiode structure (for <300 nm to 3500 nm and beyond detection) consisting of the InP substrate, InAsP buffer layer, and InGaAs absorption layer, and InGaAs doping layer are shown. However, this covers all kinds of InGaAs (single or multiple layers having different bandgaps), covering the broad spectral ranges detector. In addition, instead of using the InAsP as the contact layer, highly doped InGaAs (not shown) can also be used. Alternatively, thin layer of highly doped InGaAs (not shown) can be used on the top of the doped InAsP layer for the ohmic contact. Alternatively, the combination of the highly doped InAsP and high doped InGaAs layers (not shown) can also be used as the contact layer.

Alternatively, detector of having broad spectral response extending from <300 nm to 3500 nm and beyond, detector structure 28 consists of the InP substrate, buffer layer, and InGaAs absorption layer, and InGaAs doping layer. In addition, instead of using the InGaAs as the doping layer, highly doped InAlAs (not shown) can also be used. In this case, the graded layer can be incorporated in the structure to reduce the minority carrier trapping at the InAlAs—InGaAs band edge discontinuity. Alternatively, the combination of the highly doped InAlAs and high doped InGaAs layers (not shown) can also be used as the contact layer.

Alternatively, highly n-doped InGaAs layer can also be used instead of highly n-doped $In_{0.47}Ga_{0.53}As$ on the top of the InP substrate and also bottom of the InGaAs absorption layer. The layer is to be made to thin to 10 nm to suppress absorption for the shorter wavelength light.

In the preferred embodiment, top and bottom incident type photodiodes and their array are described. In the preferred embodiment, we have explained the fabrication process compatible for standard fabrication process. In the top-incident type photodiode array, the metal line can be fabricated to connect the each photodiode element with the outside pad using of the nano imprint technology or molding. This would help to increase the photodiode surface wider and/or to increase the fill-factor of the array. Increasing the fill-factor and also increasing the number of the elements in the array would help to increase the detection resolution. In the case of bottom incident type photodiode array, individually operated pixel can be bonded and in this case metal line is not required to draw from the photodiode surface. This increases the resolution of detection.

In the present invention, InGaAs is used the absorption layer and InP which block the absorption of the visible light and shorter wavelength are etched to extend the InGaAs absorption far below the shorter wavelength. To increase the spectrum bandwidth, various InGaAs contents may necessary. In the present invention, InP is used as the substrate, any kinds of substrate and the structure can be used, which has lattice match with InGaAs. III-V substrate such as GaAs, GaSb, InSb, or GaN etc. can be used with proper matching layer with InGaAs layer, which is used as the absorption layer.

In the preferred embodiment, an example using InGaAs layer as the absorption layer is explained for the purpose of an example to show the benefit of the invention, not limiting the invention. This is can also utilized in other material systems such as HgCdTe, CdTe, Cadmium gallium indium selenide (CIGS), Si, Si:Ge, Ge, SiC, GaAs, or GaN based materials.

The present invention has been described above by way of its embodiments. However, those skilled in the art can reach various changes and modifications within the scope of the idea of the present invention. Therefore it is to be understood that those changes and modifications also belong to the range of this invention. For example, the present invention can be variously changed without departing from the gist of the invention, as indicated below.

According to the present invention, it is our object to have the photodiode structure, which could provide the broad spectral detection capability ranges from <300 nm to over 1700 nm or as high as 3500 nm and beyond, high quantum efficiency >70%, and high frequency response (e.g. >10 GHz frequency response at 3 dB for the photodiode area of below 25 sq. micron).

According to the present invention, it is our also object to provide the photodiode array of N.times.N elements which could also provide the broad spectral detection capability ranges from <300 nm to over 1700 nm or as high as 3500 and beyond, high quantum efficiency >70%, and high frequency response. Better frequency response can also be expected if the metal line is designed as the transmission line of coplanar line or microstrip line types.

It is also our object to have the photodiode structure, which can provide stable spectral detection performance under wide range of temperature variation. Unlike a wide-wavelength wafer bonded photodiode, this present invented photodiode is capable of operating at any temperature with slight variation in the quantum efficiency for long wavelengths as the bandgap increases with decreasing temperature.

In the preferred embodiment, the photodiode array of N×N elements where each photodiode can be addressable independently is explained. Photodiode array having broad spectral detection ranges can also have the structure where the photodiode elements are connected by the two-axis electrode.

The present invention is expected to be found practically use in multiple purpose applications such as telecommunication, imaging (where CCD cannot be used), and also many sensing applications, and also in the applications including surveillance, satellite tracking, advanced lidar systems, etc. The most important advantage of this photodiode is that the performance will not be degraded under wide range of temperature variation, which eliminates the use of the temperature controller. Other advantage of this invention is that conventional fabrication technology can be used to fabricate the single photodiode or its array herein described.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A photodiode comprising:
   a first metal contact;
   a semiconductor substrate of a first conductivity type,
   buffer layer of said first conductivity type,
   an absorption region electrically connected to said first metal contact,
      wherein said absorption region comprises a plurality of pillars,
         wherein said absorption region has a cross-sectional area of less than 25 square micrometers, and each said pillar includes a charge separation junction,
         and wherein said pillars are arranged in an array either randomly or with a certain pitch;
   and a second metal contact electrically connected to said absorption region, wherein said first metal contact is connected to said semiconductor substrate or said buffer layer,
      and wherein each said pillar comprises:
         at least one In-based layer of said first conductivity type, same conductivity type as said buffer layer and said semiconductor substrate;
         at least one InGaAs absorption layer; and
         at least one In-based layer of a second conductivity type opposite to said first conductivity type.

2. The photodiode of claim 1, wherein said charge separation junction is selected from the group consisting of p-n type, p-i-n type, quantum-well type, quantum-dot type, and conducting type.

3. The photodiode of claim 1, further comprising a material between said pillars selected from the group consisting of insulator material, polymer material, and semiconductor material.

4. The photodiode of claim 1,
   wherein said first metal contact is connected to said semiconductor substrate or said buffer layer, on the same surface face as said absorption region, and extends away from said semiconductor substrate;
   wherein said first metal contact terminates on the top side of said photodiode, thereby allowing access to said first metal contact from the same surface as said second metal contact;
   and wherein said first metal contact is insulated from said absorption region by a non-conductive material.

5. The photodiode of claim 1, wherein either all or a substantial portion of said semiconductor substrate is removed, thereby substantially preventing absorption of incident light into said semiconductor substrate upon illumination of the device from the bottom side.

6. The photodiode of claim 1, wherein said first metal contact comprises a plurality of first metal contacts disposed on each said pillar, and a common electrode connects said plurality of first metal contacts.

7. The photodiode of claim 1, wherein said substrate is selected from a group consisting of InP, GaSb, GaAs, InSb, SiC, and Si:Ge.

8. The photodiode of claim 1, wherein said at least one In-based buffer layer comprises of a $InAs_{0.6}P_{0.4}$ and/or a combination of, $InAs_{0.6}P_{0.4}$ and $InAs_yP_{1-y}$, and/or their graded composition layer.

9. The photodiode of claim 1, wherein said charge separation junction in each said pillar, comprises of a plurality of charge separation junctions formed by a plurality of said InGaAs layers of n or p conductivity types.

10. A bottom illuminated photodiode comprising:
    a first metal contact;
    a semiconductor substrate, wherein said semiconductor substrate is material selected from the group consisting of Si, CdTe, ZnCdTe, and CdSe;
    at least one Cd-based buffer layer,
    an absorption region electrically connected to said first metal contact,
       wherein said absorption region comprises a plurality of pillars,
          wherein said absorption region has a cross-sectional area of less than 25 square micrometers, and each said pillar includes a charge separation junction,
          and wherein said pillars are arranged in an array either randomly or with a certain pitch;
    and a second metal contact electrically connected to said absorption region,
       wherein said first metal contact is connected to said semiconductor substrate or said at least one Cd-based buffer layer,
       wherein a substantial portion or all of said semiconductor substrate is removed from the backside of said semiconductor substrate, thereby substantially preventing absorption of incident light into said semiconductor substrate upon illumination of the device from the backside, and
       wherein each said pillar comprises at least one HgCdTe layer of p or n conductivity type.

11. The photodiode of claim 10, wherein said charge separation junction is selected from the group consisting of p-n type, p-i-n type, quantum-well type, quantum-dot type, and conducting type.

12. The photodiode of claim 10, further comprising a material between said pillars selected from the group consisting of insulator material, polymer material, and semiconductor material.

13. The photodiode of claim 10,
wherein said first metal contact is connected to said semiconductor substrate or said at least one Cd-based buffer layer, on the same surface face as said absorption region, and extends away from said semiconductor substrate;
wherein said first metal contact terminates on the top side of said photodiode, thereby allowing access to said first metal contact from the same surface as said second metal contact;
and wherein said first metal contact is insulated from said absorption region by a non-conductive material.

14. The photodiode of claim 10, wherein said backside removed portion has a shape comprising a single or a plurality pillars.

15. The photodiode of claim 10, wherein said first metal contact comprises a plurality of first metal contacts disposed on each said pillar, and a common electrode connects said plurality of first metal contacts.

16. The photodiode of claim 10, further comprising an anti-reflection layer disposed on the bottom surface.

17. The photodiode of claim 10, wherein said at least one Cd-based buffer layer comprises of a CdTe layer.

18. The photodiode of claim 10, wherein said charge separation junction in each said pillar, comprises of plurality of charge separation junctions formed by a plurality of said HgCdTe layers of n or p conductivity types.

19. The photodiode of claim 10, wherein each said pillar further comprising a Cd-based buffer layer which is a part of the at least one Cd-based buffer layer.

20. A photodiode comprising:
a first metal contact;
a semiconductor substrate having a backside and a front side,
wherein a substantial portion or all of said semiconductor substrate is etched out from the backside so as to avoid absorption of incident light from the backside into said semiconductor substrate, and wherein said semiconductor substrate has a first conductivity type;
a buffer layer;
wherein said buffer layer comprises the same conductivity type as said semiconductor substrate,
and wherein said buffer layer is disposed at front side of said semiconductor substrate;
an absorption region formed at said buffer layer,
wherein said absorption region comprises:
a plurality of pillars;
wherein said absorption region has a cross-sectional area of less than 25 square micrometers,
wherein each said pillar comprises a junction selected from a group consisting of p-n type, p-i-n type, quantum-dot type, and conducting type, and
wherein said pillars are arranged in an array either randomly or with a certain pitch;
and a material between said pillars
wherein said material is selected from a group consisting of insulator material, polymer material, and semiconductor material,
wherein said pillars comprise a material selected from a group consisting of Ge, PbS, CdTe, CdGaInSe, InAsP, GaAs, Si:Ge, InP, InGaAs, SiC, HgCdTe, and a combination thereof;
an anti-reflection coating disposed on the backside of said semiconductor substrate; and
a second metal contact electrically connected to said absorption region
wherein said first metal contact is electrically connected to said buffer layer or the front side of said substrate and extends away from said front side;
wherein said first metal contact terminates on the top surface of said photodiode, thereby allowing access to said first metal contact from the same surface as said second metal contact;
and wherein said first metal contact is insulated from said absorption region by a non-conductive material.

21. The photodiode of claim 20, wherein said backside etched out portion has a shape comprising a single or plurality pillars.

* * * * *